(12) United States Patent
Athani et al.

(10) Patent No.: US 7,739,647 B2
(45) Date of Patent: Jun. 15, 2010

(54) METHODS AND SYSTEM FOR CONFIGURABLE DOMAIN SPECIFIC ABSTRACT CORE

(75) Inventors: Guruprasad Ramananda Athani, Bangalore (IN); Ranju Philip Abraham, Cochin (IN); Shashi Basavappa Chinnikatte, Bangalore (IN)

(73) Assignee: Infosys Technologies Ltd. (IN)

( * ) Notice: Subject to any disclaimer, the term of this patent is extended or adjusted under 35 U.S.C. 154(b) by 77 days.

(21) Appl. No.: 11/810,350

(22) Filed: Jun. 5, 2007

(65) Prior Publication Data

US 2008/0066045 A1 Mar. 13, 2008

(30) Foreign Application Priority Data

Sep. 12, 2006 (IN) .................. 1655/CHE/2006

(51) Int. Cl.
G06F 17/50 (2006.01)
(52) U.S. Cl. .................. 716/16; 716/1; 716/2; 716/3; 716/17; 716/18; 712/10; 712/15; 712/34; 712/35; 712/203; 712/220; 710/8; 710/9; 710/10
(58) Field of Classification Search .................. 716/1–3, 716/16–18; 712/10, 15, 34, 35, 203, 220; 710/8–15
See application file for complete search history.

(56) References Cited

U.S. PATENT DOCUMENTS

| | | | |
|---|---|---|---|
| 5,684,980 A | 11/1997 | Casselman | |
| 5,870,497 A | 2/1999 | Galbi et al. | |
| 6,023,742 A * | 2/2000 | Ebeling et al. | 710/107 |
| 6,052,773 A | 4/2000 | DeHon et al. | |
| 6,079,010 A | 6/2000 | D'Arcy et al. | |
| 6,085,317 A | 7/2000 | Smith | |
| 6,230,307 B1 | 5/2001 | Davis et al. | |
| 6,233,651 B1 | 5/2001 | O'Neill et al. | |
| 6,408,428 B1 * | 6/2002 | Schlansker et al. | 716/17 |
| 6,415,384 B1 | 7/2002 | Dave | |
| 6,594,810 B1 | 7/2003 | Reblewski et al. | |
| 6,803,787 B1 | 10/2004 | Wicker, Jr. | |
| 6,836,839 B2 | 12/2004 | Master et al. | |
| 6,941,539 B2 | 9/2005 | Hammes | |
| 6,968,454 B2 | 11/2005 | Master et al. | |
| 6,986,021 B2 | 1/2006 | Master et al. | |
| 7,042,899 B1 | 5/2006 | Vaida et al. | |
| 7,394,288 B1 * | 7/2008 | Agarwal | 326/39 |
| 2008/0288909 A1 * | 11/2008 | Leijten-Nowak | 716/16 |

* cited by examiner

*Primary Examiner*—Thuan Do
*Assistant Examiner*—Nghia M Doan
(74) *Attorney, Agent, or Firm*—Lerner, David, Littenberg, Krumholz & Mentlik, LLP

(57) ABSTRACT

The present invention provides a configurable domain specific abstract core (DSAC) for implementing applications within any domain. The DSAC comprises at least one function specific abstract module (FSAM) configurable at a plurality of stages for implementing a predetermined function belonging to one or more applications in the domain. The FSAM comprises a function specific abstract logic (FSAL) for implementing functional logic and a micro state engine (MSE) for generating and monitoring one or more control signals, at least one of the control signals being generated by execution of a dynamic script for controlling the FSAL. The DSAC further comprises one or more buffer modules for data exchange among one or more FSAMs, and for temporary storage of data, one or more programmable data path connection maps comprising a set of interconnections, for configuring data paths among the one or more FSAMs and the one or more buffers, and a programmable hardware software interface module for coupling with one or more external computing devices. The DSAC may be configured at a design configuration stage, an application initialization configuration stage and a run time configuration stage. The DSAC implements a data driven control flow architecture.

34 Claims, 19 Drawing Sheets

$$\begin{pmatrix} C00 & C01 & C02 & C03 & C04 & C05 & C06 & C07 \\ C10 & C11 & C12 & C13 & C14 & C15 & C16 & C17 \\ C20 & C21 & C22 & C23 & C24 & C25 & C26 & C27 \\ C30 & C31 & C32 & C33 & C34 & C35 & C36 & C37 \\ C40 & C41 & C42 & C43 & C44 & C45 & C46 & C47 \\ C50 & C51 & C52 & C53 & C54 & C55 & C56 & C57 \\ C60 & C61 & C62 & C63 & C64 & C65 & C66 & C67 \\ C70 & C71 & C72 & C73 & C74 & C75 & C76 & C77 \end{pmatrix}$$

| | |
|---|---|
| If Addr = "0000" → C0 = C00, C1 = C01, C2 = C02, C3 = C03 | If Addr = "1000" → C0 = C04, C1 = C05, C2 = C06, C3 = C07 |
| If Addr = "0001" → C0 = C10, C1 = C11, C2 = C12, C3 = C13 | If Addr = "1001" → C0 = C14, C1 = C15, C2 = C16, C3 = C17 |
| If Addr = "0010" → C0 = C20, C1 = C21, C2 = C22, C3 = C23 | If Addr = "1010" → C0 = C24, C1 = C25, C2 = C26, C3 = C27 |
| If Addr = "0011" → C0 = C30, C1 = C31, C2 = C32, C3 = C33 | If Addr = "1011" → C0 = C34, C1 = C35, C2 = C36, C3 = C37 |
| If Addr = "0100" → C0 = C40, C1 = C41, C2 = C42, C3 = C43 | If Addr = "1100" → C0 = C44, C1 = C45, C2 = C46, C3 = C47 |
| If Addr = "0101" → C0 = C50, C1 = C51, C2 = C52, C3 = C53 | If Addr = "1101" → C0 = C54, C1 = C55, C2 = C56, C3 = C57 |
| If Addr = "0110" → C0 = C60, C1 = C61, C2 = C62, C3 = C63 | If Addr = "1110" → C0 = C64, C1 = C65, C2 = C66, C3 = C67 |
| If Addr = "0111" → C0 = C70, C1 = C71, C2 = C72, C3 = C73 | If Addr = "1111" → C0 = C74, C1 = C75, C2 = C76, C3 = C77 |

FIG. 16

METHODS AND SYSTEM FOR CONFIGURABLE DOMAIN SPECIFIC ABSTRACT CORE

FIELD OF INVENTION

The present invention relates to design of configurable domain specific abstract core for embedded applications. More specifically, the present invention provides architecture for implementing embedded applications and improving performance of embedded applications in power constrained environments.

BACKGROUND OF THE INVENTION

Embedded applications perform specialized tasks and are designed by taking into consideration various parameters such as speed, cost, efficiency and robustness. With an increase in the complexity of embedded applications, low power consumption and flexibility in design have also emerged as parameters which must be taken into consideration while designing an embedded application. Typically, embedded applications comprising few processing instructions are implemented on hardware whereas embedded applications comprising a large number of processing instructions are implemented on microprocessors. In instances where speed of computation is critical for performance of an embedded application, the application may partly be implemented on hardware and partly as one or more software modules running on a microprocessor.

Depending on the number and nature of processing instructions, an embedded application may be designed either as a hardware implementation comprising field programmable gate array (FPGA)/application specific integrated circuits (ASICs), or a microprocessor based implementation or else as a hybrid design involving both microprocessor and hardware implementations. In the recent times multi-core system on a chip (SoC) are being widely used for implementing hybrid design of embedded applications. Multi-core SoCs comprise more than one central processing units (CPU) on a single chip.

There are certain limitations associated with each of the three design implementations of embedded applications. While hardware implementations may be optimized for speed, they are inflexible and are difficult to implement if the embedded application is complex in nature. Microprocessor based designs are flexible but are typically slower than hardware implementations. In order to increase the speed of computation in microprocessor based designs, clock speeds of the microprocessor have to be raised, which in turn results in greater power consumption.

The hybrid design of embedded applications is implemented in order to achieve a high speed of computation as well as flexibility in design by appropriate distribution of the processing instructions between hardware and software. Processing instructions which relate to tasks such as those requiring substantial CPU time, those that are critical to overall performance of the embedded application and those that are repeated often during processing of the embedded application, are typically implemented on hardware. However, distribution of the processing instructions between hardware and software often requires data to be moved across the hardware and software which affects the speed of computation. Further, in a hybrid design the modules of the embedded application that are implemented in hardware remain inflexible. A hybrid design employing multi-core SoCs is most suited for embedded applications that are amenable to pipelining. The use of multi-core SoCs leads to an achievement of greater performance levels at lower clock speeds. However, total power dissipated in such implementations is higher due to the presence of multiple CPUs.

As enormity and complexity of algorithms increase, flexibility becomes important. For portable devices, power considerations assume greater significance. Thus, from a power-flexibility stand point current approaches have limitations and hence there is need for a new approach that would achieve flexibility typical in software implementations with speeds (or close to it) of a hardware implementation.

Power consumption in an embedded application designed on a CMOS chip may be classified as static and dynamic. The dominant component of power consumption is dynamic power consumption and a first order approximation of dynamic power consumption is represented by the formula:

$$P = A \times C \times F \times V^2 \qquad (1)$$

where P denotes power, C denotes an effective switch capacitance, V denotes supply voltage, F denotes a frequency of operations and A denotes the number of switches per clock cycle.

For a typical design implementation of an embedded application if the voltage and underlying technology used in developing the required hardware is assumed to be constant, the power dissipated is directly proportional to frequency at which the hardware is run and the resources consumed by the hardware. The resources comprise switching transistors. A software design implementation of an embedded application comprises a sequence of instructions run on a microprocessor and therefore requires a higher value of F, whereas hardware design implementations typically run a number of operations in parallel and hence require a higher value of A. Since power is proportional to both F and A, it is a better measure of comparison across hardware and software implementations.

Experimental evidence suggests that for a generic embedded application, a software or microprocessor based implementation leads to greater power consumption than a hardware implementation of the same. Greater power consumption may be attributed to the flexibility offered by a microprocessor platform. Flexibility of microprocessor based implementations results from the following factors:

Instruction sets that support generic operations

Microprocessors are similar to finite state machines although number of states transitioned is much higher than that in a typical FPGA/ASIC implementation. The state transitions in microprocessors are controlled using "fetch and execute" model and hence are more generic.

Highly flexible movement of data between general purpose registers, arithmetic and logic unit (ALU) and memory.

Software (program code running on a microprocessor) determines the timing of movement of data and also the sequence of operations.

Hence, a microprocessor provides a generic platform capable of running any kind of embedded application supporting design of flexible embedded applications. Hardware implementation on the other hand optimizes on power by being specific or inflexible.

The power efficiency of a microprocessor based implementation or a software implementation may be improved by sacrificing generality of the microprocessor platform. This generality in architecture offered by a microprocessor based design platform enables the microprocessor to be used for implementing any kind of application across various domains. However, since an embedded application is typically designed for performing a specific task and requires a degree of flexibility in design, the complete generality offered by a microprocessor may not always be required. Since, generality offered by a microprocessor platform comes at the expense of power there is need for a system that would provide a trade off between the excess generality offered by a microprocessor platform and a gain in power efficiency.

Further, in recent times complex embedded applications are being pushed onto portable/hand-held/mobile devices. Such devices are required to perform complex computational tasks at low levels of power consumption in order to ensure that the higher processing power does not have an adverse impact on battery requirements. Hence, there is need for an embedded application design methodology that achieves flexibility such as is typical in software implementations with a speed of computation similar to that achieved via a hardware implementation.

SUMMARY OF THE INVENTION

A configurable domain specific abstract core (DSAC) for implementing applications within any domain is provided. The DSAC comprises at least one function specific abstract module (FSAM) configurable at a plurality of stages for implementing a predetermined function belonging to one or more applications in the domain. The FSAM comprises a function specific abstract logic (FSAL) for implementing functional logic and a micro state engine (MSE) for generating and monitoring one or more control signals, at least one of the control signals being generated by execution of a dynamic script for controlling the FSAL.

The DSAC further comprises one or more buffer modules for data exchange among one or more FSAMs, and for temporary storage of data, one or more programmable data path connection maps comprising a set of interconnections, for configuring data paths among the one or more FSAMs and the one or more buffers, and a programmable hardware software interface module for coupling with one or more external computing devices.

The DSAC may be configured at a design configuration stage, an application initialization configuration stage, and a run time configuration stage. Further, the data paths among the one or more FSAMs and the one or more buffers may be configured by executing one or more static scripts or one or more instructions written in a programming language. The DSAC implements a data driven control flow architecture.

The FSAM further comprises a programmable connection map specifying data path connections and regulating data flow within the FSAL and may be configured at an application initialization configuration stage or at a run time configuration stage of the DSAC by a configuration tool via a configuration interface. The configuration tool processes one or more initialization values of one or more registers of the FSAM and a static script to convert them to a binary file, the binary file being downloaded onto the FSAM during the application initialization stage of the DSAC. A static script or instructions written in a programming language may be executed for specifying data flow within the FSAM.

The MSE comprises a local program memory for storing a dynamic script, a program counter for navigating through a series of instructions specified by the dynamic script and a set of registers for storing intermediate values and states. The local program memory is an extended shared multi-port memory connected to two or more FSAMs. The MSE further comprises a decision vector space that determines a next instruction to be navigated by the program counter, a configurable logic block that applies a configurable logical operation on a set of control signals and/or registers, an extended program memory control to extend the local program memory and a control driver for buffering and driving control signals.

The buffer module is operable in a plurality of operation modes based upon nature of data being exchanged. The buffer module may be operated in a ping pong mode when the data being exchanged is in the form of packets of a predetermined size, in a first in first out mode when the data being exchanged is in the form of a continuous stream and in a pass through mode when the data being exchanged does not require to be temporarily stored. The buffer module may be operated in conjunction with a software hook interface enabling software modules running on external computing devices to read from and write into the buffer module.

The programmable hardware software interface module comprises an external bus interface for enabling interaction between the domain specific abstract core and an external computing device, the external bus interface communicating with the external computing device via an external system bus, and an internal configuration and data interface for enabling communication of the programmable hardware software interface module with the one or more function specific abstract modules via a configuration interface bus and a hook interface bus. The programmable hardware software interface module further comprises a JTAG interface for testing and debugging of the DSAC by an external microprocessor.

A method of designing a configurable FSAM within a configurable DSAC, for implementing a predetermined function belonging to applications in a domain is also provided. The method comprises the steps of identifying a function to be implemented within the domain; abstracting the identified function into a generic function; building the abstracted generic function by using logic modules and building data path connections among the logic modules; classifying the data path connections as those that are specific to a particular application and those that are generic for the implementation of the function across the domain; embedding functional logic within the FSAM having data paths being configured by using static scripts and control signals being generated by execution of a dynamic script within a MSE; defining and initializing one or more of a plurality of components of the MSE for enabling the FSAM to perform the identified function and the corresponding abstracted generic function; and synthesizing the FSAM with the DSAC.

The step of classifying the data path connections as those that are specific to a particular application and those that are generic for the implementation of the function across the domain comprises the step of making the data path connections, that are generic for the implementation of the function across the domain, non-configurable. The data path connections that are specific to a particular application may be made configurable by either using one or more static scripts or by executing instructions written in a programming language. The control signals may be generated by a micro state engine within the function specific abstract module by executing instructions written in a programming language.

The step of defining and initializing one or more components of the MSE comprises the steps of defining and initializing a local program memory for storing and executing the dynamic script; defining and initializing a program counter to navigate through a series of instructions as specified by the dynamic script stored in local program memory; and defining and initializing a set of registers for storing intermediate values and states. The step of defining and initializing one or more components of the micro state engine further comprises the steps of: defining and initializing a decision vector space that determines a next instruction to be navigated by the program counter; defining and initializing a configurable logic block that applies a configurable logical operation on a set of control signals and/or registers; defining and initializing an extended program memory control to extend the local program memory; and defining and initializing a control driver for buffering and driving control signals.

BRIEF DESCRIPTION OF THE ACCOMPANYING DRAWINGS

The present invention is described by way of embodiments illustrated in the accompanying drawings wherein:

FIG. 16 depicts an organization of 8 by 8 DCT cosine constants.

DETAILED DESCRIPTION OF THE INVENTION

The present invention provides a domain specific abstract core (DSAC) or a programmable logic device that allows a user of the device to customize logic functions performed by the device by using software controls. The system, method and programmable hardware disclosed provide abstraction across a plurality of applications within a domain. In various embodiments of the present invention, the embedded applications that have similar functional goals are coupled together as belonging to the same domain.

The disclosure is provided in order to enable a person having ordinary skill in the art to practice the invention. Exemplary embodiments herein are provided only for illustrative purposes and various modifications will be readily apparent to persons skilled in the art. The general principles defined may be applied to other embodiments and applications without departing from the spirit and scope of the invention. The terminology and phraseology used is for the purpose of describing exemplary embodiments and should not be considered limiting. Thus, the present invention is to be accorded the widest scope encompassing numerous alternatives, modifications and equivalents consistent with the principles and features disclosed. For purpose of clarity, details relating to technical material that is known in the technical fields related to the invention have been briefly described or omitted so as not to unnecessarily obscure the present invention.

The present invention would now be discussed in context of embodiments as illustrated in the accompanying drawings.

Figure 1A:
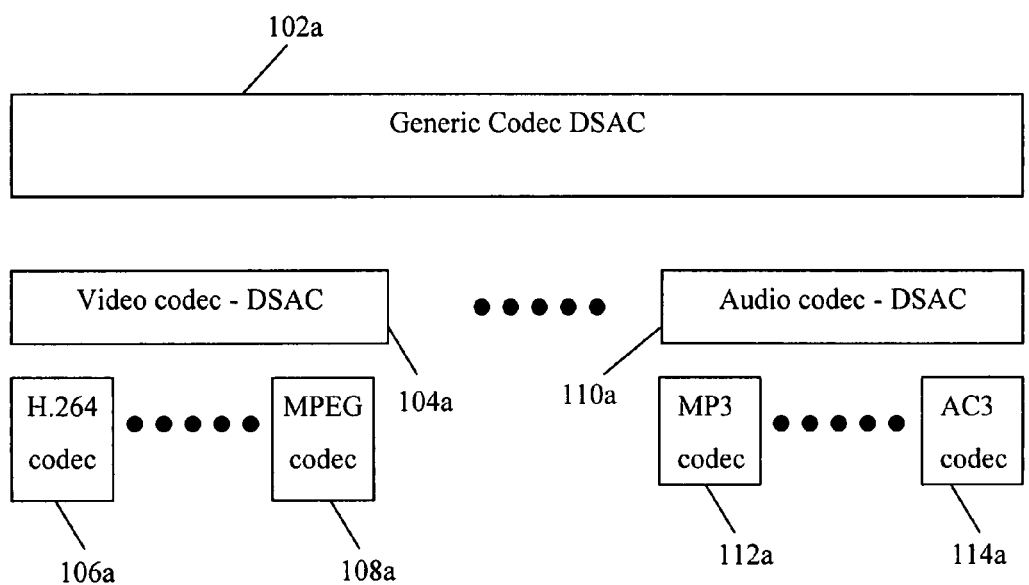
FIG. 1A illustrates Domain Specific Abstract Cores (DSACs) that may be provided for various domains.

FIG. 1A illustrates DSACs that may be provided for various domains. The term domain refers to the scope of any subject or area for which a DSAC in accordance with the present invention is provided. Elements within a domain subscribe to any one or more of a common set of characteristics, knowledge, procedures, or adhere to similar set of principles. Embedded applications that have one or more of the same functional goals may be taken together as belonging to the same domain. Applications within a domain may have similar processing stages with functional goals that may be abstracted beyond specific implementations in individual applications. Applications within a domain may not require all the generality provided by microprocessor architecture. Such generality may be offset against savings in power by providing a platform that is specific to the domain. A DSAC corresponding to a specific domain provides a platform which is flexible enough to implement all selected applications within the domain with gain in power efficiency. A DSAC may be designed corresponding to domains such as gaming, image and speech recognition, communication protocols etc. By way of an example, one may design a DSAC 104a for a video codec domain. Video codec DSAC 104a may be configured for implementing any video codec application such as H.264 codec application 106a, MPEG codec application 108a and so on. Similarly, one may design a DSAC 110a for an audio codec domain. Audio codec DSAC 110a may be configured for implementing any audio codec such as MP3 codec 112a, AC3 codec 114a, etc. Similarly, one may expand the domain to include other compression applications such as data codec and create a generic codec DSAC 102a. In other words, as will be appreciated by a person skilled in the art, generic codec DSAC 102a may be configured to implement any standard type of compression and decompression applications using the present invention. The processing stages of the application may be designed in a generic manner in order to create an efficient DSAC.

Figure 1B:
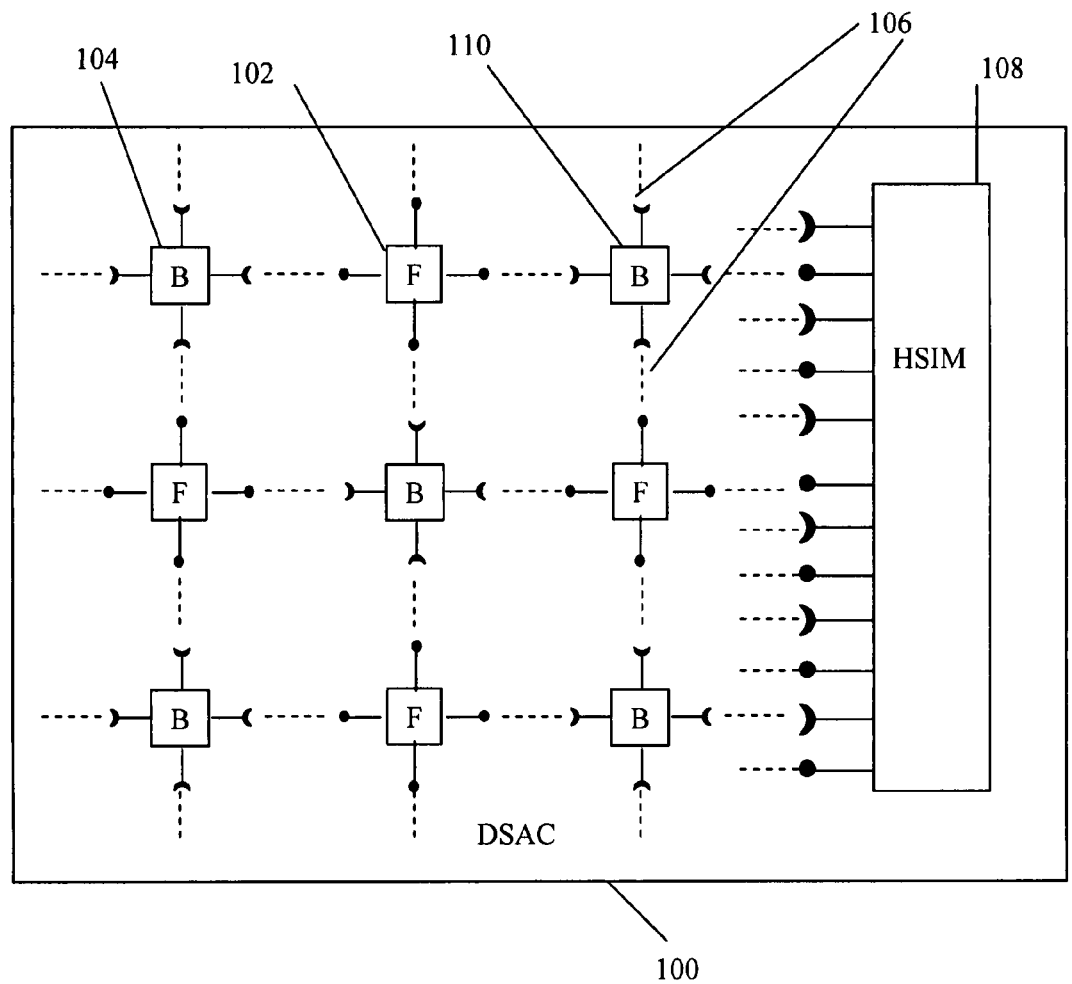
FIG 1B illustrates a block diagram of a DSAC, in accordance with one embodiment of the present invention.

FIG. 1B illustrates a block diagram of a DSAC. DSAC 100 comprises one or more function specific abstract modules (FSAMs) 102, one or more buffers 104, one or more data path connection maps 106, and a hardware software interface module (HSIM) 108.

FSAMs 102 are primary functional units of DSAC 100 and may be described as processing modules of DSAC 100. FSAMs 102 provide the specific type of processing needed for implementing a predetermined function within the domain of DSAC 100. Each FSAM 102 may be designed to perform a different function within the domain of DSAC 100. Each FSAM 102 comprises a Function Specific Abstract Logic (FSAL) and a control engine termed as Micro State Engine (MSE), which runs a dynamic script for monitoring and managing generation of control signals within FSAM 102. Each FSAM 102 operates at a configurable clock frequency and performs a specific predetermined function. For example, while a first FSAM may perform a discrete cosine transform (DCT), a second FSAM may perform entropy encoding, with the first and the second FSAMs operating at same or different clock frequencies. The structure and functions of FSAMs 102 are described in subsequent sections of the disclosure.

Buffers 104 are temporary storage elements provided within DSAC 100. In various embodiments of the present invention, buffers 104 may be used for enabling data exchange between FSAMs 102 and acting as a pool of extended program memory for FSAMs 102 in addition to being used for temporary storage of data. Data path connection maps 106 are configurable connection maps used for configuring data paths among FSAMs 102 and buffers 104, and may be depicted as a matrix of interconnecting lines. Data path connection maps 106 may be configured by using data flow scripting or static scripting. Configuration of data path connection maps 106 by using static scripting is discussed in subsequent sections of the disclosure. HSIM 108 acts as an interface between DSAC 100 and an external computing device or a storage device. In various embodiments of the present invention, the external computing device may be a microprocessor, custom hardware, a flash memory etc.

Figure 2:
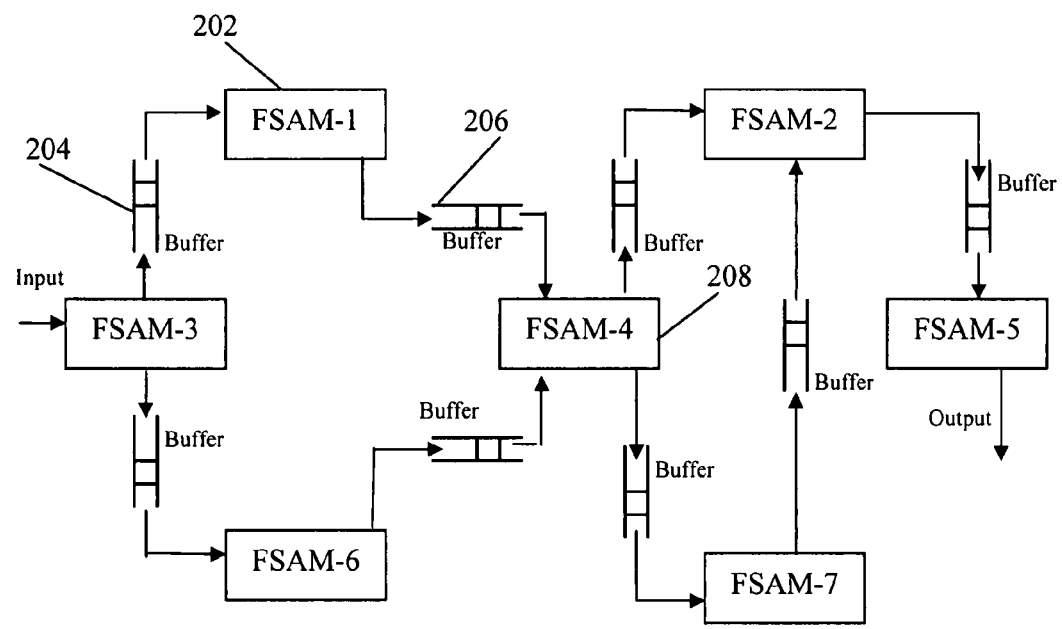
FIG. 2 illustrates a data driven control flow paradigm of the DSAC architecture, in accordance with one embodiment of the present invention.

FIG. 2 illustrates a data driven control flow paradigm of the DSAC architecture. FSAMs 202 are the processing nodes and buffers 204 are the storage nodes. In an embodiment of the present invention, FSAM 202 commences function specific processing when relevant data is available at a corresponding input buffer 204. When FSAM 202 completes processing it writes resultant data into a corresponding output buffer 206. Output buffer 206 may be the input buffer for a next FSAM 208 and availability of data in the input buffer triggers commencement of processing of the data in FSAM 208. Thus, the timing of processing of every FSAM is entirely driven by the movement of data within the DSAC. In a distributed system, data driven control flow architecture makes the task of performance optimization easier. In an embodiment of the invention, performance optimization may be achieved simply by tuning clock frequencies of the FSAMs.

The DSAC disclosed in the present invention provides for flexibility in configuring elements such as data path connection maps and FSAMs. The DSAC is used to create a chip designed to implement an embedded application. The DSAC provides for a layered configurability involving configuring elements at a layer 1 which is also a chip design stage, at a layer 2 which is a stage when the embedded application is initialized and at a layer 3 which is a run time stage.

Figure 3A:
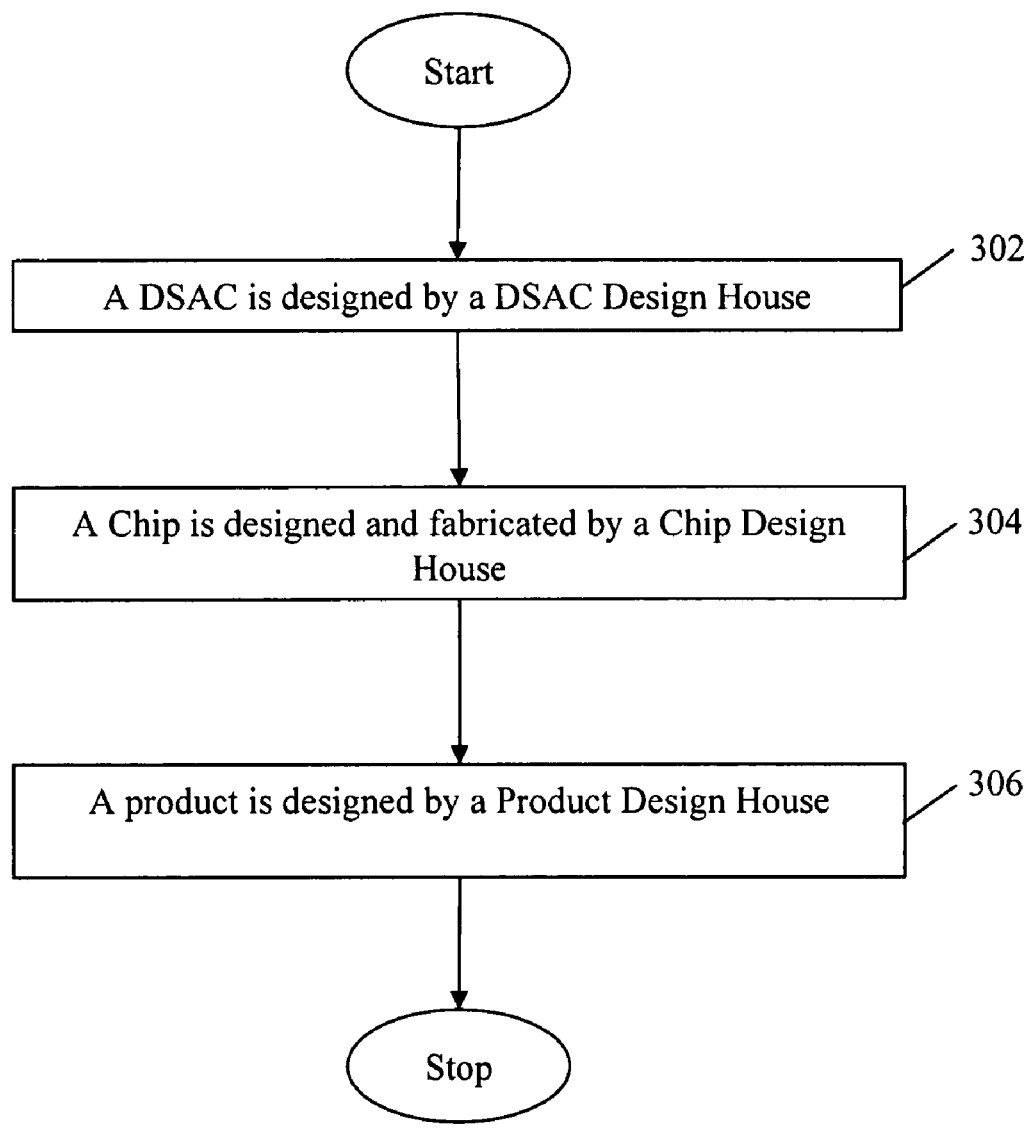
FIG. 3A illustrates the functions performed by various entities such as a DSAC design house, a chip design house, and a product design house.

FIG. 3A illustrates the functions performed by various entities such as a DSAC design house, a chip design house and a product design house. At step 302, a DSAC design house designs a DSAC for a domain, and determines the extent of configurability provided at various layers/stages. Once a DSAC is designed it is handed over to a chip design house. At step 304, the chip design house applies layer 1 configuration to the DSAC in order to create one or more chips, based on market and application requirements. The one or more chips produced by the chip design house are passed on to a product design house. At step 306, the product design house uses the one or more chips to design one or more products by applying layer 2 and layer 3 configurations.

Figure 3B:
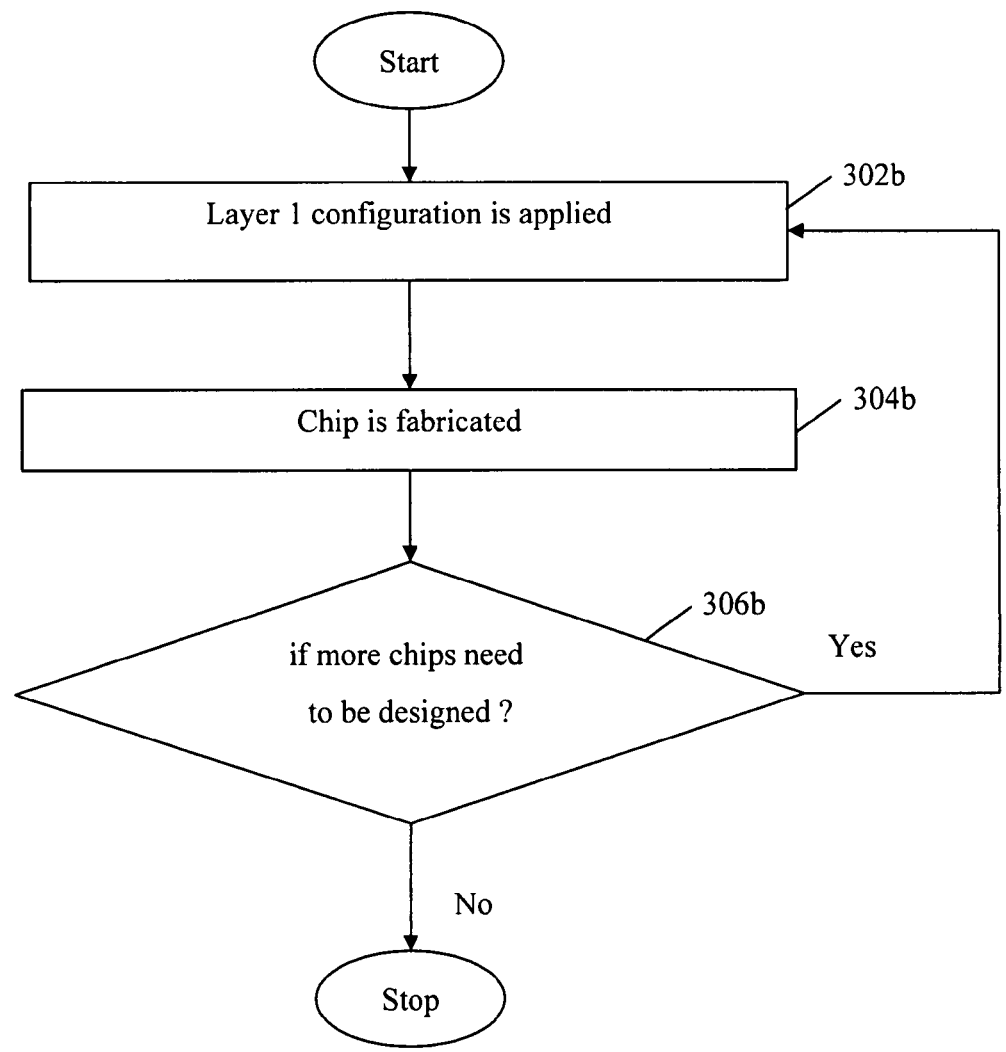
FIG. 3B illustrates the functions performed at a layer 1 configuration stage.

FIG. 3B illustrates the functions performed at a layer 1 configuration stage. Layer 1 configurability is applied to a DSAC by a chip design house for creating one or more chips. At step 302b layer 1 configuration is applied to a DSAC to support all targeted applications. Layer 1 configuration includes selecting FSAMs required for the targeted applications from among the FSAMs provided in the DSAC, defining clock separations for the selected FSAMs, determining sizes of buffers and memory pools required for the targeted applications, determining size of micro state engine components etc. At step 304b a chip is designed to support one or more applications within the domain of the DSAC. At step 306b it is determined if more chips are required to be designed. If it is determined that more chips are require to be designed, steps 302b and 304b are repeated.

Figure 3C:
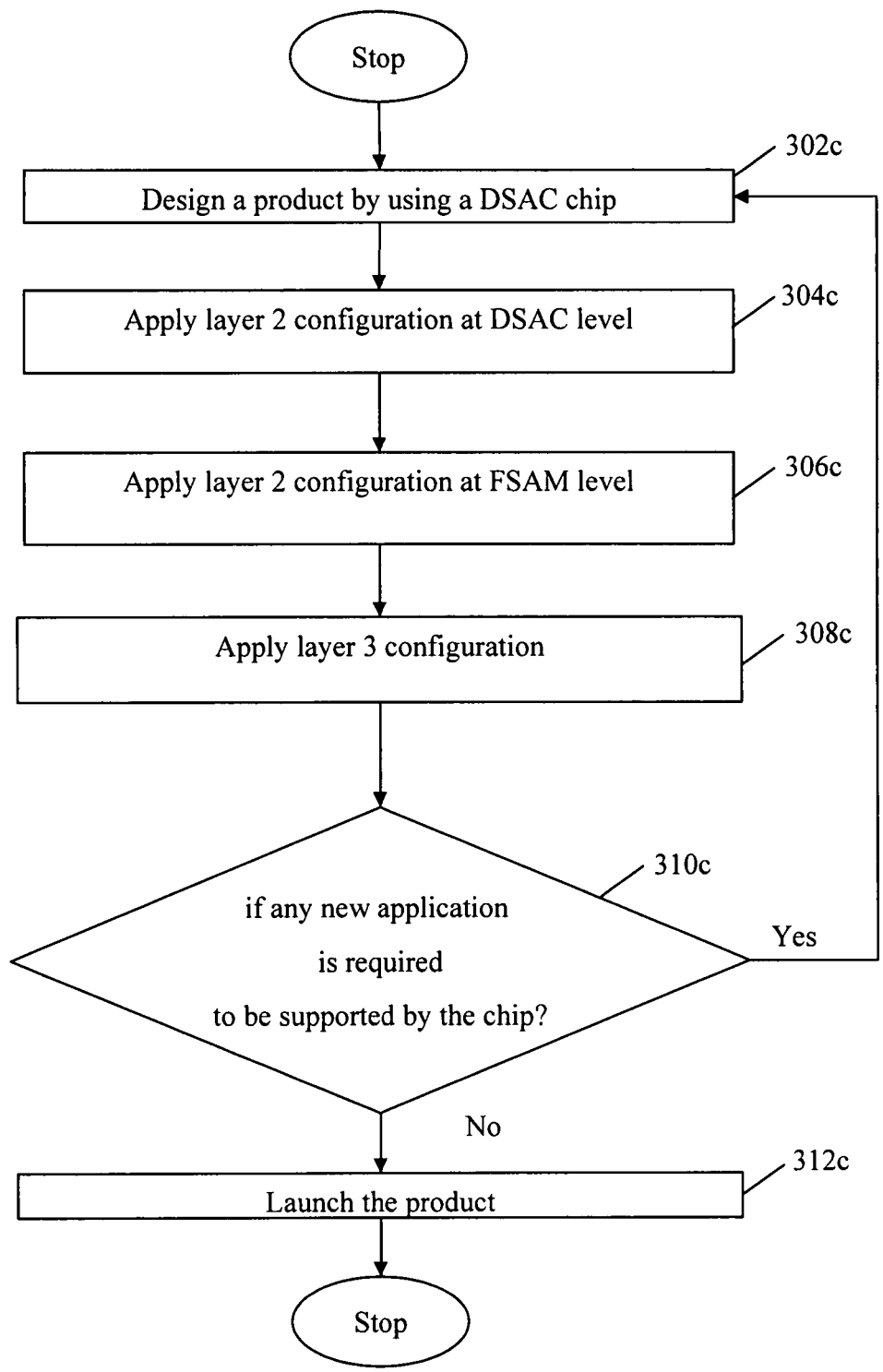
FIG. 3C illustrates the functions performed at layer 2 and layer 3 configuration stages.

FIG. 3C illustrates the functions performed at layer 2 and layer 3 configuration stages. The steps illustrated in FIG. 3C depict the functions performed by a product design house. At step 302c, a specific product is designed by using the chip on which a DSAC is implemented. At step 304c layer 2 configuration is applied at the DSAC level in order to customize the chip to implement a particular application within the domain of the DSAC. Layer 2 configuration at the DSAC level comprises determining a buffer threshold for data exchange buffers, obtaining a high level data connection map for enabling data flow which is also termed as static scripting, selecting clock frequencies for FSAMs, allocating extended program memory for FSAMs, creating software hooks where required etc. At step 306c layer 2 configuration is applied at an FSAM level. Layer 2 configuration at the FSAM level comprises coding of MSEs of each FSAM which is also termed as dynamic scripting and enabling data flow configurations within each FSAM which is also termed as static scripting. At step 308c, layer 3 configuration is applied. Layer 3 configuration enables the applications supported by the chip to initialize parameters that are typically determined at run time. At step 310c it is determined if a new application is required to be supported by the chip. If it is determined that new applications require to be supported by the chip steps 302c and onwards are repeated. If it is determined at step 310c that no new applications are required to be supported by the chip the product is launched at step 312c.

A FSAM within a DSAC may be described as an abstract functional module. For example, a "spatial transform" FSAM may be built as an abstraction of Discrete Cosine Transform (DCT), Inverse Discrete Cosine Transform (IDCT), and integer DCT functions in a video codec DSAC. The "spatial transform" FSAM may then be configured at layer 1, layer 2 or layer 3 stages to perform functions of IDCT for a JPEG decoder or Integer DCT for a MPEG decoder.

Figure 4:
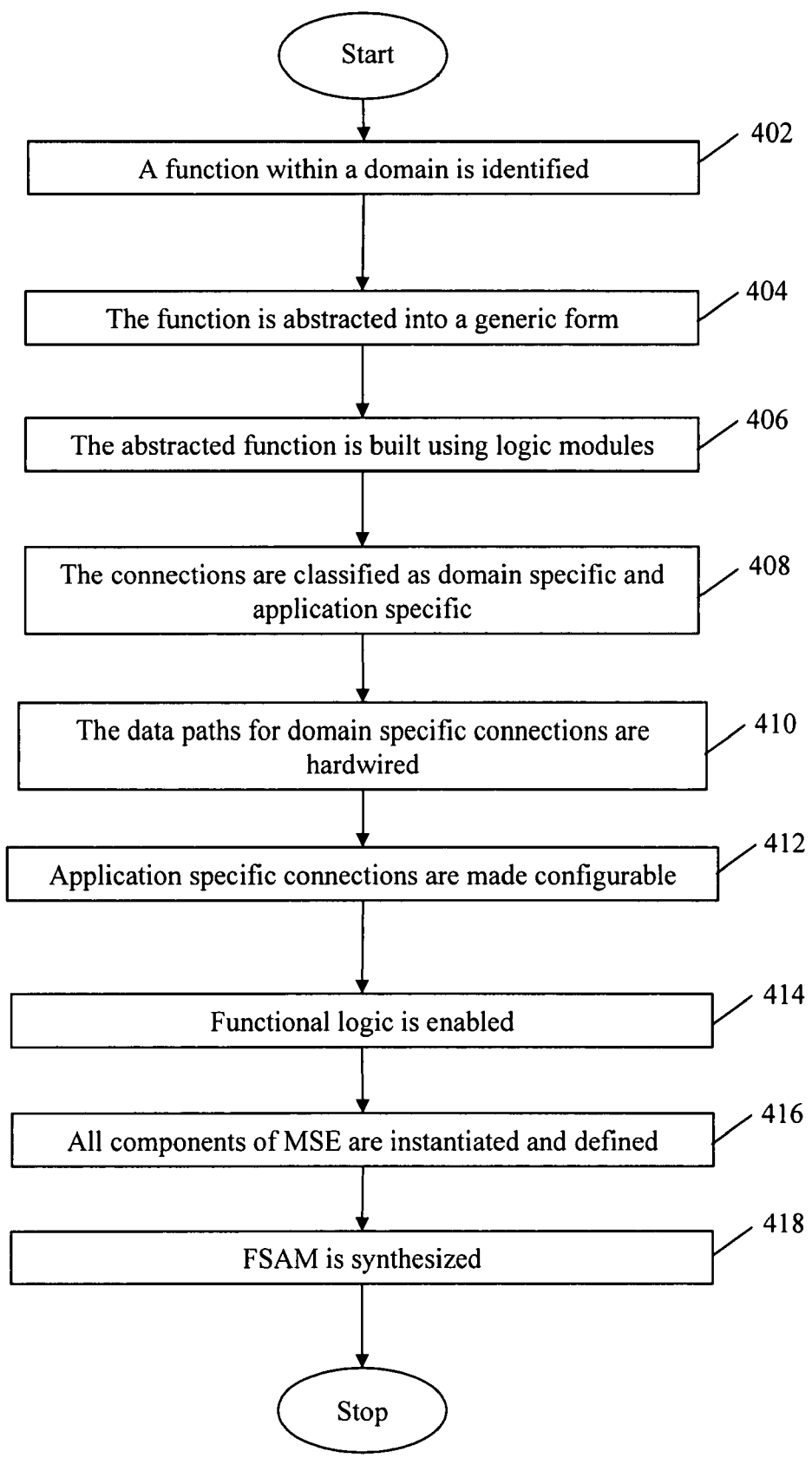
FIG. 4 illustrates a method of identifying and designing functional specific abstract modules (FSAMs) within a DSAC.

A FSAM performs an abstract function within the domain of a DSAC. For example, if a DSAC is designed for the video codec domain, functions such as entropy coding and decoding, quantization, de-quantization, transformation, motion estimation and compensation etc., may be implemented as FSAMs within the DSAC. FIG. 4 illustrates a method of identifying and designing FSAMs within a DSAC. At step 402, one or more functions that are to be implemented as FSAMs within the domain of the DSAC are identified. For example, if the DSAC belongs to the domain of video codec, DCT may be one of the functions identified.

At step 404, the identified function is abstracted into a more generic function within the domain that may be implemented as a FSAM. For example, the function identified as DCT may be abstracted to spatial transforms, which cover a variety of transforms including DCT. At step 406, the abstracted generic function is built using logic modules such as registers, gates, adders, multipliers etc.

At step 408, connections between the logic modules termed as data paths are classified as domain specific and application specific. For example, common connections which are required for implementing any spatial transform may be classified as domain specific and connections which are required specifically for implementing DCT may be classified as application specific.

At step 410 data paths for domain specific connections are hardwired. At step 412 configurable data paths for application specific connections are created. These data paths are configured during layer 2 configuration stage, using data flow scripts or static scripts.

At step 414 functional logic is created. The functional logic is controlled by control signals generated by dynamic scripts running on the micro state engine of the FSAM. At step 416, all components of the micro state engine are instantiated and defined for the FSAM. At step 418, the FSAM is synthesized.

Figure 5:
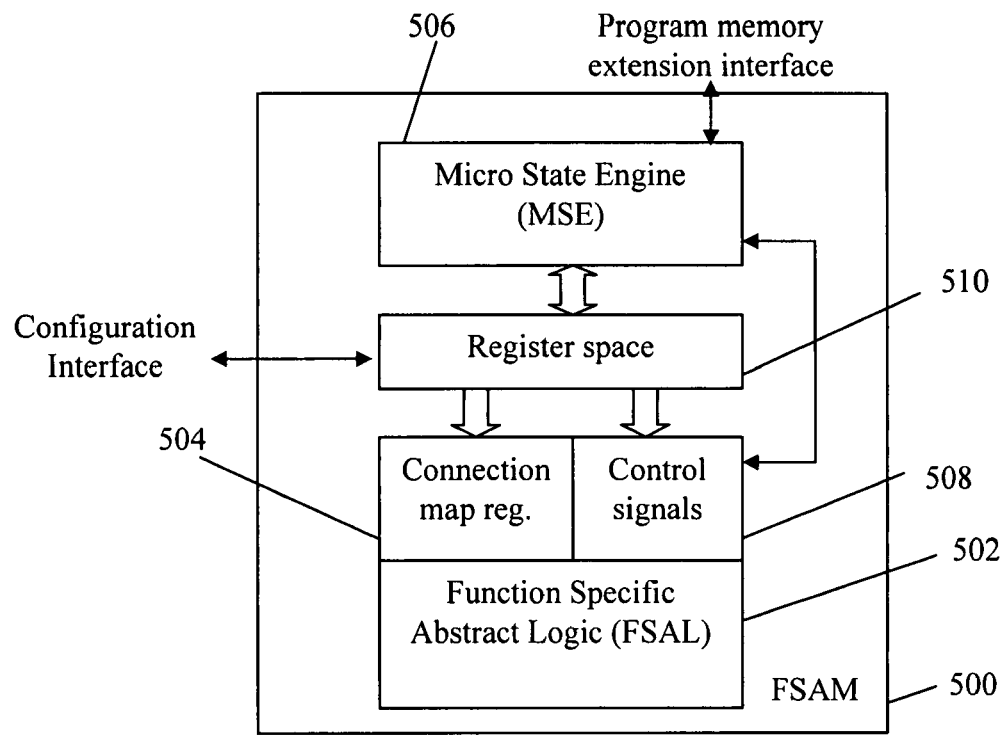
FIG. 5 illustrates the architecture of a FSAM.

FIG. 5 illustrates the architecture of a FSAM in accordance with an embodiment of the present invention. FSAM 500 comprises function specific abstract logic (FSAL) 502, connection map register 504, micro state engine (MSE) 506, control signals 508, and register space 510.

The FSAL 502 comprises components and data paths required to implement the abstract generic functional logic corresponding to FSAM 500. Connection map register 504 stores data path connection values and regulates data flow within FSAL 502. In an embodiment of the present invention, data path connection values may be configured at a layer 2 stage in order to achieve specific implementations of FSAL 502.

MSE 506 is a control engine which monitors a set of internal and external control signals 508. MSE 506 executes a dynamic script to generate output control signals. The output control signals direct FSAL 502 to perform functions specified in the dynamic script. MSE 506 operates like a "fetch and execute" machine in run time and generates control signals 508 with predetermined timing sequences. The dynamic script resides in an internal memory of MSE 506. The internal memory of MSE 506 may be extended via a program memory extension interface.

Register space 510 comprises a plurality of registers required for enabling FSAM 500 to perform a predetermined function. Examples of registers within register space 510 include control registers, configuration registers, status registers, function specific registers, and general purpose registers. Register space 510 is accessible via a configuration interface.

FSAM 500 may be configured at layer 2 and layer 3 stages via the configuration interface. In one embodiment of the present invention, a DSAC configuration tool is used for performing the layer 2 and layer 3 configurations of FSAM 500. The DSAC configuration tool processes initialization values of FSAM registers, a static script, and a dynamic script to output a binary file. The binary file generated by the configuration tool is then downloaded onto the FSAM 500 during an application initialization stage of the DSAC, and enables configuration of the FSAM 500.

In an embodiment of the present invention, a static script is implemented for specifying data flow within FSAM 500 and a dynamic script is used for generating the programmable control signals 508. The DSAC configuration tool processes the static script and generates a bit string, which is used by FSAM 500 to determine programmed data paths for a specific usage of FSAM 500. The dynamic script is executed by MSE 506.

In various embodiments of the present invention, data path connections specifying data flow between two or more FSAMs and data path connections specifying data flow within a FSAM may be configured by using a static script. The static script comprises a generic textual data flow representation language. Examples of data flow representation language used for generating static scripts include:

Node: a DSAC may be depicted as a data flow graph or a Petri-net model within which each FSAM may be depicted as a Node. Within a FSAM, logic modules or pipe line stages facilitating data flow may be represented as Nodes Node statement: data flow in and out of a node may be represented by a node statement such as Node (input parameter list; output parameter list);

Where

Node=name of a node

Input parameter list (x1, x2 . . . )=names of inputs to the node

Input parameters may be scalar or vector

Vector input parameters=x(m-n) implying xm . . . to . . . xn

Output parameter list (y1, y2, y3, . . . )=names of outputs to the node

Output parameters may be scalar or vector

Vector output parameters=y(m-n) implying ym . . . to . . . yn

For example: Multiplier_A (data1(7-0), data2(7-0); product_A(15-0));

implies that a node Multiplier_A takes 8 bits of data1 and 8 bits of data2 and produces 16 bits of product_A as output.

Connections: If two nodes are connected via a data path, then name of the data will appear in the input parameter list of one of the nodes and in the output parameter list of the other node. For example, Multiplier_A (data1(7-0), data2(7-0); product_A(15-0)); and Saturate_A product_A(15-0); Satproduct(11-0));

implies that 16 bits of data product_A goes from node Multiplier_A to node Saturate_A.

Figure 6:
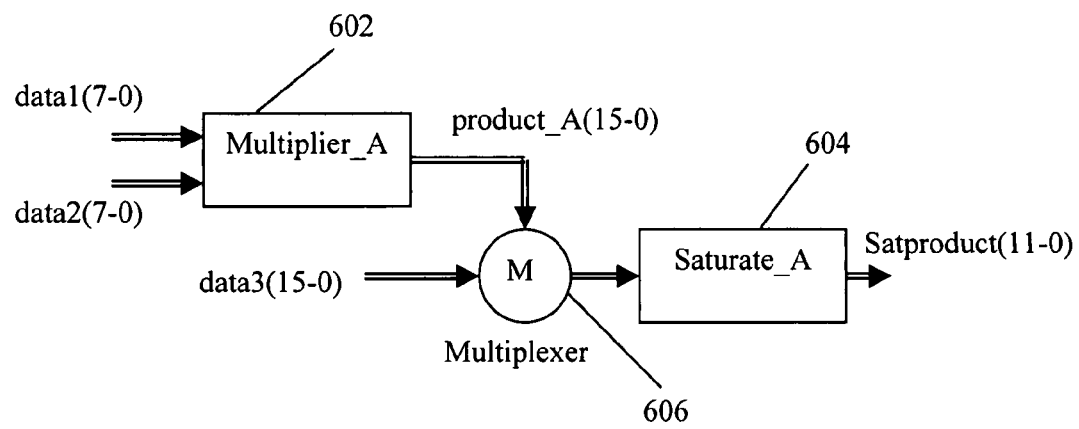
FIG. 6 illustrates a data flow graph corresponding to a FSAM.

Configurable Connection: "logical or" operator "|" is used to represent configurable connections such as:

Saturate_A (product_A(15-0)| data3(15-0); Satproduct (11-0));

A static script is a set of node statements which specify a data flow graph. The data flow graph illustrated in FIG. 6 may be depicted in a static script by using two node statements such as:

Multiplier_A (data1(7-0), data2(7-0); product_A(15-0)); and

Saturate_A (product_A(15-0)| data3(15-0); Satproduct (11-0));

where Multiplier_A 602 and Saturate_A 604 depict nodes of the static script. Further, multiplexer 606 may be used for implementing a configurable connection such as a "logical or" operator "|".

In an embodiment of the present invention, a DSAC level static script specifying data flow between two or more FSAMs and a FSAM level static script specifying data flow within each FSAM may be provided. Configurable connections in these scripts provide alternate data paths that may be chosen to specify data flows in order to implement different functions via FSAMs or DSAC. In an embodiment of the present invention, one or more of the configurable connections may be hard wired by a chip designer i.e. configured at layer 1 stage, in order to limit the scope of a DSAC for a given target segment. In another embodiment of the present invention, one of the configurable connections may be selected by a product designer at a layer 2 stage in order to make the DSAC implement a specific application. A DSAC configuration tool enables the selection of configurable connections.

Figure 7:
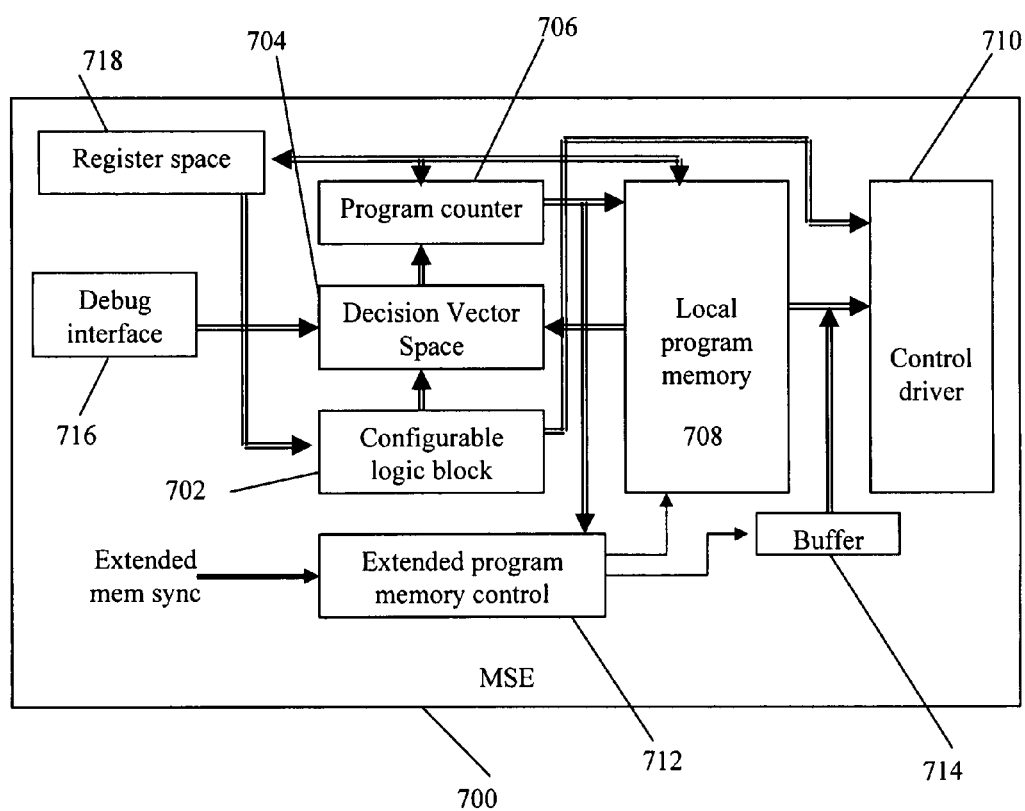
FIG. 7 depicts the architecture of a Micro State Engine (MSE)

FIG. 7 depicts the architecture of a MSE. MSE 700 comprises a configurable logic block 702, decision vector space 704, program counter 706, local program memory 708, control driver 710, extended program memory control 712, buffer 714 and register space 718. Configurable logic block 702 is coupled with decision vector space 704. Decision vector space 704 stores predetermined parts of control words termed as decision vectors. Configurable logic block 702 is programmed when MSE 700 is initialized and operates in conjunction with decision vector space 704 to provide a required level of programmability. Control words are generated by execution of a dynamic script. Program counter 706 navigates though a series of instructions as specified by the dynamic script stored in local program memory 708 and generates control signals. Control driver 710 buffers and drives control signals. Control driver 710 provides a level of isolation and stability to the control signals. Local program memory 708 may be extended via extended program memory control 712. A register space 718 is used to store internal states and intermediate values. A debug interface 716 is provided for debugging internal circuit of MSE 700 externally.

Figure 8:
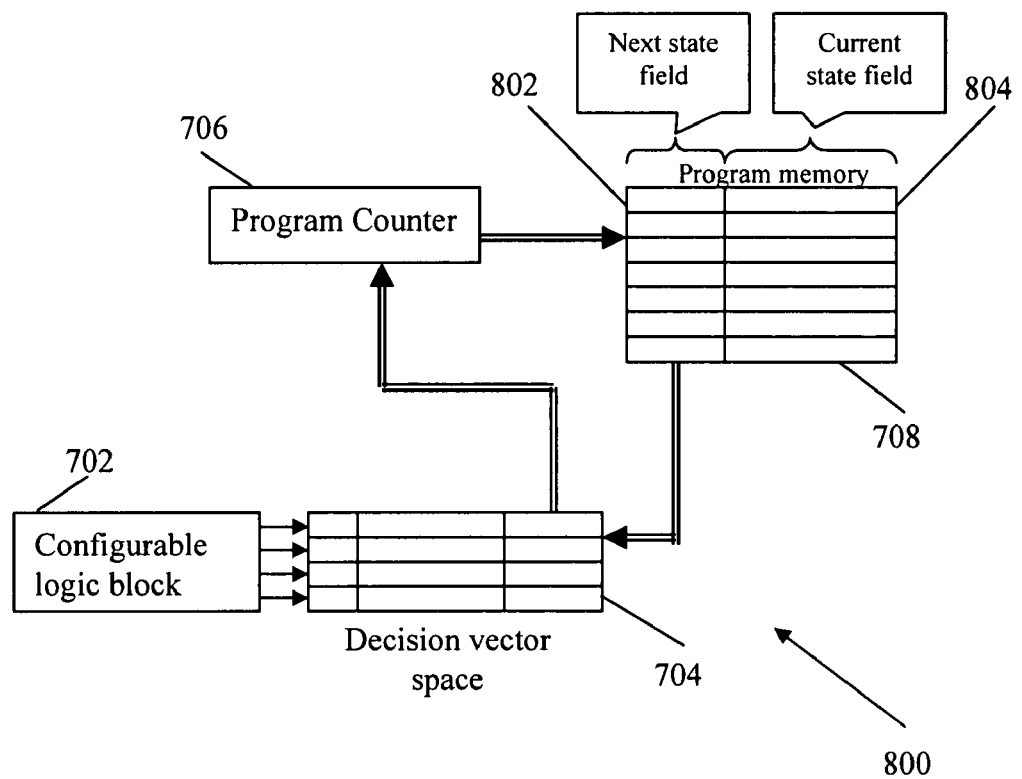
FIG. 8 depicts execution of a dynamic script by a MSE.

FIG. 8 depicts execution of a dynamic script by MSE 700, in accordance with an embodiment of the present invention. A DSAC configuration tool processes a dynamic script into a micro code. The micro code is stored in local program memory 708 when MSE 700 is initialized. The micro code comprises a sequence of control words stored in successive locations of local program memory 708. A control word comprises two fields namely a current state field and a next state field. Current state field comprises bit state values (1 or 0) of all control signals generated in a current state and are stored at location 804 of local program memory 708. Next state field comprises an index value pointing to a location in decision vector space 704 and is stored at location 802 of local program memory 708.

At successive clocks program counter 706 holds a new value. The program counter 706 holds the address of the control word currently being executed by MSE 700 from among the sequence of control words contained in the micro code. The current state field of the control word is used to drive the control signals. The next state field of the control word is used to point to a decision vector in the decision vector space 704. The value to be loaded into program counter 706 is decided based on the output of the configurable logic block 702 and the contents of the decision vector in decision vector space 704. The value is loaded into the program counter in a next clock.

At every clock the current state field value stored at the location within local program memory 708 that is addressed by the program counter 706 at that clock drives control signals via control driver 710. In an embodiment of the present invention, control driver 710 enables latching and buffering of control signals. A plurality of time synchronized control signals may be combined and represented as a single control signal in the current state field. Control driver 710 translates the combined control signals into individual control signals, which are subsequently output as control-out signals. Control-out signals may also be generated in a combinatorial fashion by using configurable logic block 702.

When a complex function that involves a heavy interplay between data and control signals is required to be implemented within an FSAM, the MSE for such an FSAM may be scaled to support microprocessor type of instructions. This makes programming the MSE easier as one may use standard tools like C-language rather than a script. An example of such a function may be a data parser.

A dynamic script may be generated by using a representation language which may be termed as MSE intrinsics. An exemplary set of MSE intrinsics comprises:

Control type declaration: specifies the manner in which each control signal is used in the dynamic script. Names of the control signals are specified while designing FSAMs. There are two type-declarations namely:

LATCH control_out_name; which refers to latched control signals. control_out_name is the name of a control signal; once a value (1 or 0) is assigned to a control signal, the value is held until it is reassigned in the script; and TRIGGER control_out_name default_val; TRIGGER changes a values of a control signal to a non default value when the name of the control signal is mentioned in the script statement default_val specifies the default value of the control signal (1 or 0).

Variable definition: Variables are internal signals which are defined as a logical combination of input control signals. Variables may be defined as: variable_name=logical_statement, conditional_statement; where logical_statement is a logical combination of input control signals using 'AND', 'OR' and 'NOT' operators; conditional_statement may take a value of 0 or 1 or a logical combination of control signals. If the value of conditional_statement is 0, then variable given by variable_name is a combinatorial output of the logical_statement. If the value of conditional_statement is 1 then variable is latched at every clock. If the value of conditional_statement is a logical combination of control signals, then this combination is the gating criteria for latching the variable. An example of a variable includes, Reg_trig=start_trig AND mod_enable OR (NOT(inhibit)), write OR read; where reg_trig is the variable name and start_trig, mod_enable, inhibit, write and read are input control signals. When write or read is high, logical combination of (start_trig AND mod_enable OR (NOT(inhibit))) is latched onto Reg_trig.

Control assignment statement: These statements are used for assigning values to output control signals. LATCH controls are assigned with explicit assignment: control_out_name=val; where val may be 1 or 0 or a variable name or a input control signal name. LATCH control assignments are used both in a combinatorial section of the script and in statements within a MSE. TRIGGER controls are assigned implicitly by just specifying the control signal name in a statement such as, control_out_name. TRIGGER control assignments are used only in statements that are executed within the MSE. All the control signals that change their states in a single clock frequency of the MSE are written in a single control assignment statement separated by commas such as, control_out_name1, control_out_name2, control_out_name5=0, control_out_name8.

Loop statement: There are three loop intrinsics, namely loop statement with a constant count value, loop statement with a count given in a register and loop statement that continues until a signal changes its state. Following is an exemplary syntax for the three loop statements:

```
LOOPN count
 // statements here ;
 END LOOP
``` where count is an absolute value of the loop count.

```
LOOPR reg_number
 // statements here;
 END LOOP
``` where reg_number is the register number in the register space of an FSAM where the count for the loop is stored. This count value may be updated during run time as layer 3 configuration.

```
LOOPU signal_name = val
 // statements here;
 END LOOP
``` where signal_name is either a name of an input control signal or a variable name; val is 1 or 0. The loop continues until the signal input control signal signal_name becomes 1 or 0 based on the val specified.

```
IF signal_name = val
 // statements here;
 ELSE
 // statemens here'
 END IF
``` where signal_name is either a name of an input control signal or a variable name; val is 1 or 0.

Following is an exemplary format in which a dynamic script may be generated:

```
CONTROL_LIST
begin
//Control type declarations
end
```

```
VARIABLE_LIST
begin
// variable definitions
end
// combinatorial control signal generation assignment statements
```

```
STATE_MACHINE label trigger = val
Begin
// write the state machine code using intrinsics here;
End
``` where trigger is either a name of an input control signal or a variable name, label is the label of a first instruction (program counter load value) in the dynamic script and val is 1 or 0.

Figure 9:
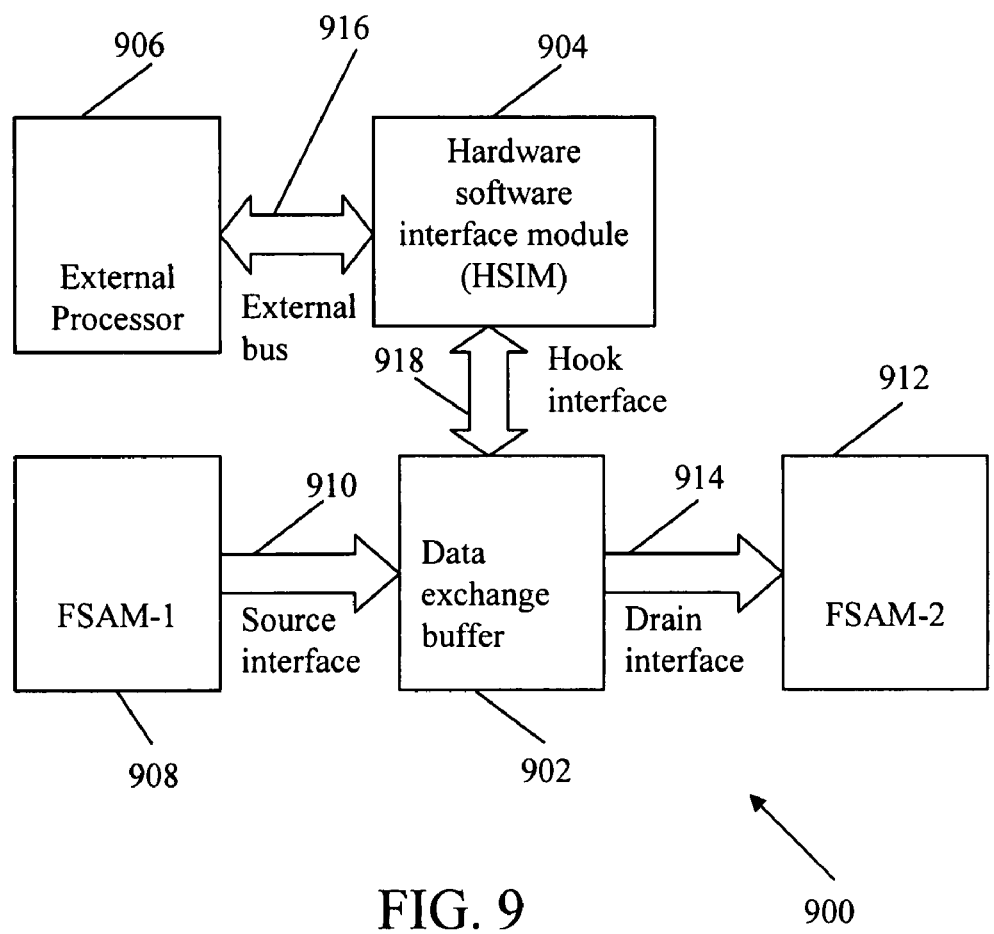
FIG. 9 illustrates a logical arrangement of a data exchange buffer (DEB) and associated interfaces within a DSAC.

In various embodiments of the present invention, a DSAC comprises two types of buffers namely, data exchange buffers (DEB) and extended program memory. DEBs enable data exchange between two or more FSAMs. FIG. 9 illustrates a logical arrangement of a data exchange buffer and associated interfaces within a DSAC. FIG. 9 illustrates a DEB 902, a hardware software interface module (HSIM) 904, an external processor 906, a first FSAM 908 coupled with DEB 902 via a source interface 910 and a second FSAM 912 coupled with DEB 902 via a drain interface 914. External processor 906 is coupled with HSIM 904 via an external bus 916. HSIM 904 is also coupled with DEB 902 via a hook interface 918.

An FSAM that requires to send data is coupled with source interface 910 of DEB 902 and an FSAM that receives data is coupled with drain interface 914 of DEB 902. DEB 902 may also be used for enabling implementation of software hooks through which software running on external processor 906 may read or write data.

In various embodiments of the present invention, data exchange buffers support three modes of operation namely, ping pong mode, first in first out (FIFO) mode, and pass through mode. A mode of operation for a DEB is selected based upon the nature of data that the DEB is expected to receive.

Figure 10:
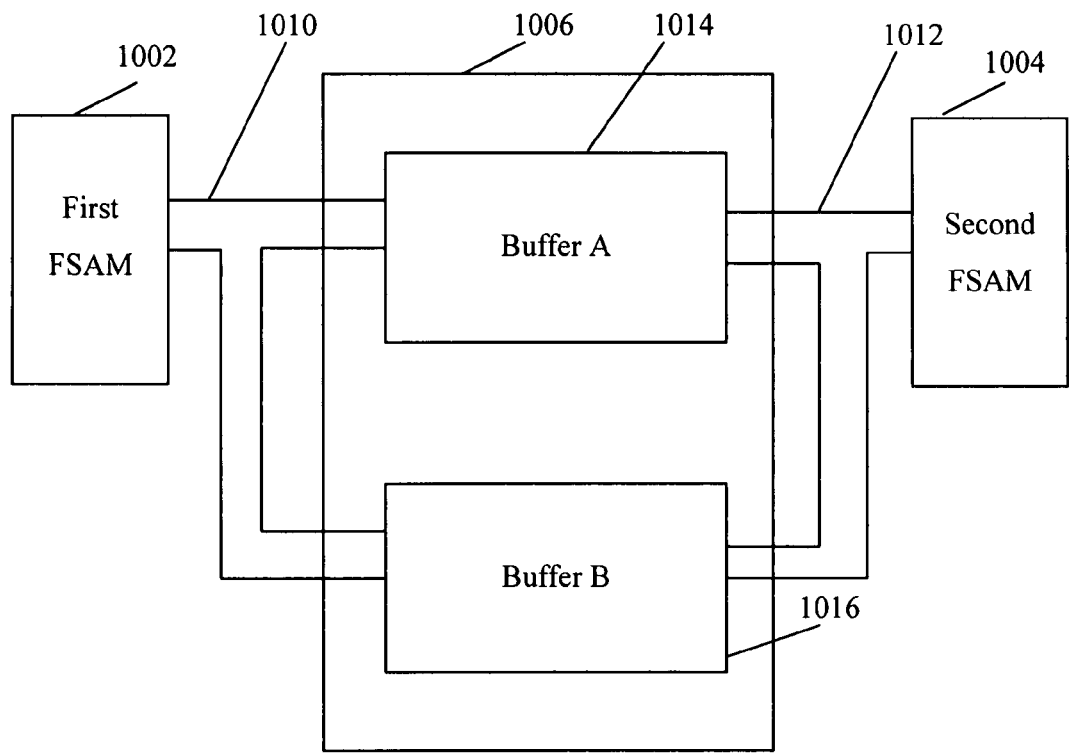
FIG. 10 depicts a ping pong mode of a DEB.

FIG. 10 depicts a ping pong mode of a DEB, in accordance with an embodiment of the present invention. FIG. 10 illustrates a first FSAM 1002, a second FSAM 1004, a DEB 1006, a source interface 1010, and a drain interface 1012. The DEB 1006 comprises a buffer A 1014 and a buffer B 1016. In the ping pong mode, First FSAM 1002 writes (sends data) into buffer A 1014 via source interface 1010. Buffer A 1014 receives data from first FSAM 1002 and when it is full, notifies second FSAM 1004 to accept data via drain interface 1012. While buffer A 1014 is drained via drain interface 1012, first FSAM 1002 simultaneously writes (sends data) into buffer B 1016 via source interface 1010. Hence, source interface 1010 and drain interface 1012 alternate between buffer A 1014 and buffer B 1016, which act as ping pong buffers. DEBs may be operated in ping pong mode when data arrives in packets of predetermined size.

When operated in a FIFO mode a DEB operates as a first in first out device. Referring to FIG. 9, when DEB 902 is operated in FIFO mode, data written into DEB 902 by first FSAM 908 is output to second FSAM 912 in a first in first out manner via drain interface 914. In an embodiment of the present invention, DEB 902 may be configured with a 'high water mark' and a 'low water mark' threshold. When number of data items in DEB 902 reaches the 'high water mark' threshold, DEB 902 sends a notification to second FSAM 912 to accept data. Second FSAM 912 continues to accept the data from the DEB 902 via drain interface 914 until the number of data items in DEB 902 reaches the 'low water mark' threshold. DEBs may be operated in FIFO mode when data arrives in a continuous stream.

Referring to FIG. 9, when DEB 902 is operated in pass through mode source interface 910 and drain interface 914 are directly coupled with each other in order to enable first FSAM 908 to directly send data to second FSAM 912 without an intermediate data storage within DEB 902.

In all modes of DEB operation, hook interface 920 may optionally be used when an external processor needs to read or write data from or into DEB 902. In such a scenario either source interface 910 or drain interface 914 is temporarily disabled.

Figure 11:
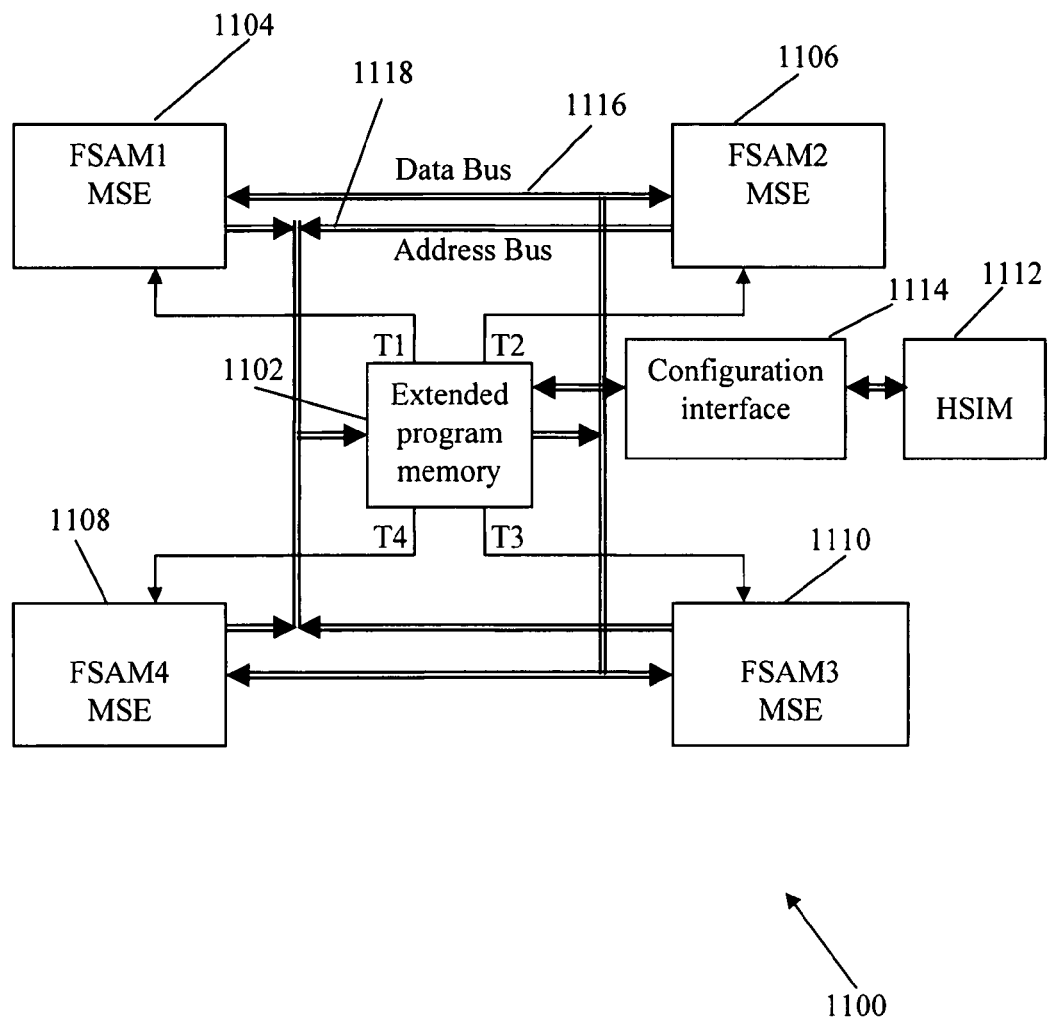
FIG. 11 illustrates an exemplary connection topology for an extended program memory module within a DSAC.

There may be more than one extended memory modules within a DSAC. The extended memory module may either be situated completely within the DSAC chip or distributed between the chip and an external memory. In the latter scenario, memory within the chip may be used as cache memory. FIG. 11 illustrates an exemplary connection topology for an extended program memory module in a DSAC. Connection topology 1100 comprises an extended program memory 1102 coupled with FSAM1 MSE 1104, FSAM2 MSE 1106, FSAM3 MSE 1108, and FSAM4 MSE 1110 respectively. Extended program memory 1102 is also coupled with HSIM 1112 via config interface 1114. FSAM1 MSE 1104, FSAM2 MSE 1106, FSAM3 MSE 1108, and FSAM4 MSE 1110 are also coupled to each other via dedicated data bus 1116 and address bus 1118, as illustrated in FIG. 11.

In various embodiments of the present invention, extended program memory 1102 accesses are time multiplexed and every enabled FSAM uses a predetermined time slot to access extended program memory 1102. The time slots are generated by extended program memory 1102 and are sent to FSAM1 MSE 1104, FSAM2 MSE 1106, FSAM3 MSE 1108, and FSAM4 MSE 1110 as signals T1, T2, T3 and T4 respectively. In an embodiment of the present invention, when only one FSAM is enabled there is no reduction in a program memory access speed of the FSAM. When more than one FSAMs are enabled program memory access speed of the FSAMs may be made equal to their local program memory access speed if the extended memory module runs at a higher frequency than the FSAMs.

In accordance with one embodiment of the present invention, the DSAC architecture may be flexible enough to accommodate the FSAM implemented as a software module running on an external microprocessor. Hence at layer 2 configuration stage, one may completely change the functionality of the FSAM from what was intended at DSAC design stage. The software module, like a typical FSAM, may read and write data from and into DEBs. HSIM is an interface between an external computing device and DSAC components and enables data exchange between software modules running on the external computing device and the DEBs. Since, a DSAC may be used in conjunction with any computing device HSIM is designed as a generic and customizable module for any given microprocessor.

HSIM also provides a slave interface to an external microprocessor, enables run time data exchanges between hardware components and software components while using software hooks, and provides access to register space of FSAMs enabling them to be configured at run time. Further, HSIM houses a bus master for making block transfers of data between an external memory and DSAC internal components. In a case where a DSAC does not require microprocessor support, HSIM provides a memory interface and a configuration interface.

Figure 12:
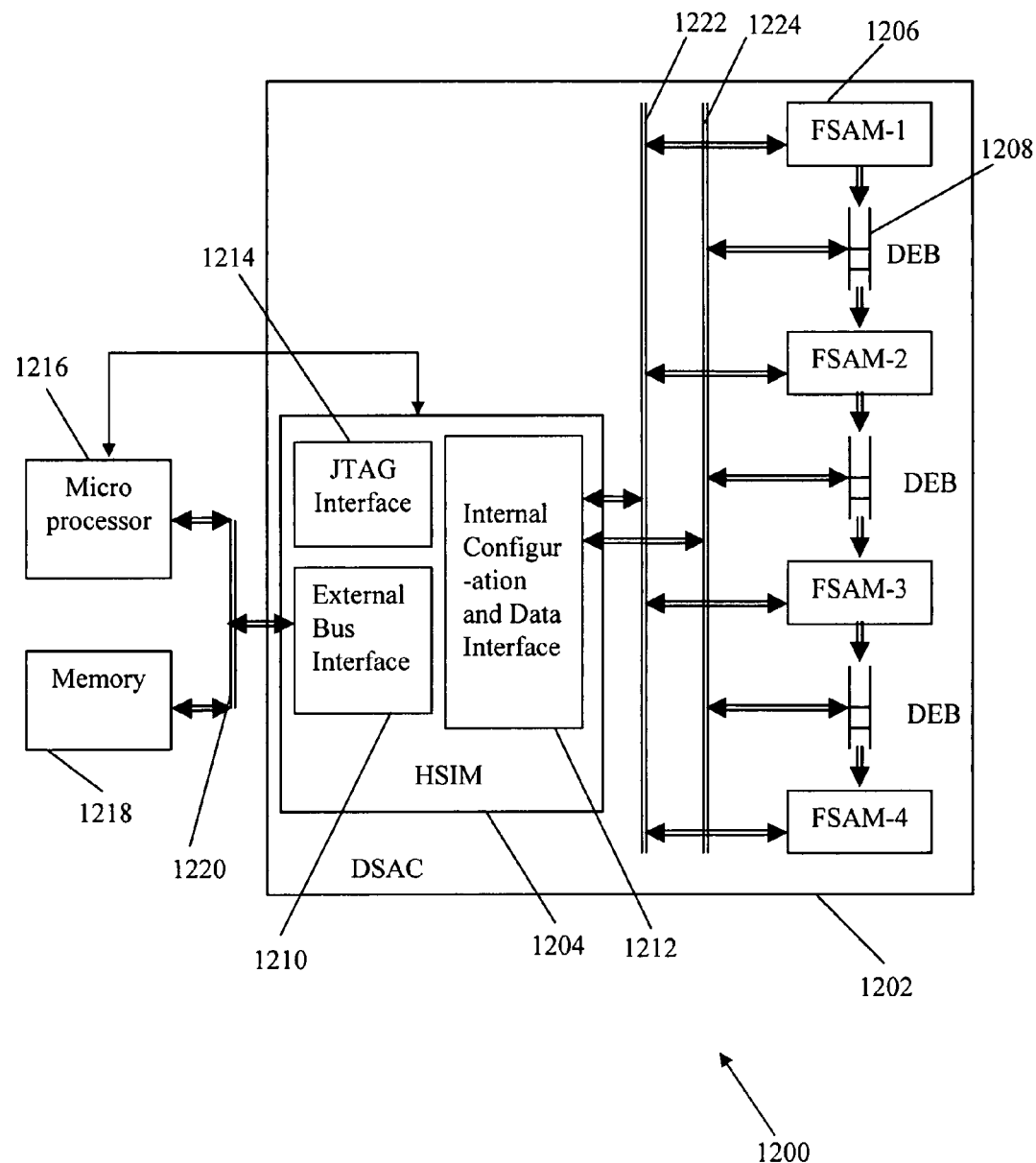
FIG. 12 illustrates a block diagram of a hardware software interface module (HSIM) within a DSAC.

FIG. 12 illustrates a block diagram 1200 of HSIM within a DSAC. DSAC 1202 comprises a HSIM 1204, one or more FSAMs 1206 and one or more DEBs 1208. HSIM 1204 comprises an external bus interface 1210, internal configuration and data interface 1212, and JTAG interface 1214. JTAG interface 1214 complies with IEEE 1149.1 standard for testing and enables testing and debugging of components of DSAC 1202 by an external microprocessor 1216. External bus interface 1210 enables interaction between DSAC 1202 and external microprocessor 1216 and an external memory 1218 via an external system bus 1220. Internal configuration and data interface 1212 enables communication of HSIM 1204 with the plurality of FSAMs 1206 within DSAC 1202 via a config interface bus 1222 and a hook interface bus 1224.

In an embodiment of the present invention, DSAC 1202 and external microprocessor 1216 is fabricated as a single integrated device and external bus interface 1210 is hard wired within HSIM 1204, thereby making JTAG interface 1214 redundant. Hence, JTAG interface 1214 may be disabled. In alternate embodiments of DSAC 1202, where DSAC 1202 is fabricated without a software based FSAM and where all functions of FSAMs 1206 are either hardwired or hardware enabled, external bus interface 1210 is designed using logic that is entirely dependent on characteristics of external system bus 1220. In said alternate embodiments, a chip containing DSAC 1202 is provided with a programmable logic area built into HSIM 1204.

Implementation of a two dimensional spatial transform as a FSAM by using static and dynamic scripts, in an exemplary embodiment of the present invention, may be carried out as described in subsequent sections of the disclosure.

Figure 13:
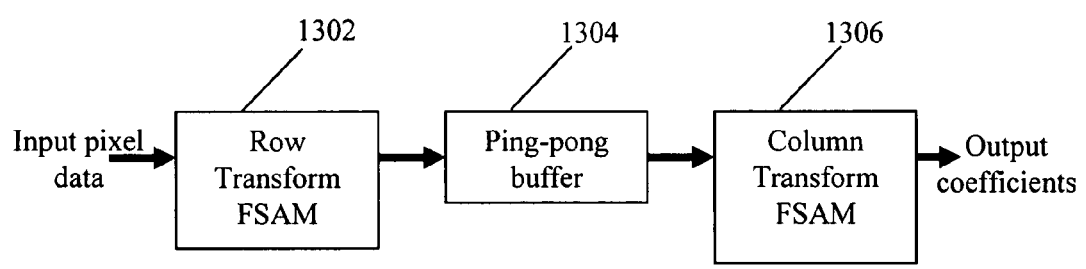
FIG. 13 is a block diagram illustrating an implementation of two dimensional Forward Discrete Cosine Transform (2D FDCT) using a row transform FSAM and a column transform FSAM.

FIG. 13 is a block diagram illustrating an implementation of two dimensional Forward Discrete Cosine Transform (2D FDCT) using a row transform FSAM and a column transform FSAM. The implementation of 2D FDCT transform comprises a row transform FSAM 1302, a ping pong buffer 1304, and a column transform FSAM 1306. Data such as pixel data of luminance and chrominance of a picture is input to row transform FSAM 1302 and after a row transformation is performed the output data is stored in ping pong buffer 1304. Column transform FSAM 1306 retrieves the output of the row transform FSAM 1302 stored in ping pong buffer 1304 and computes a corresponding column transform.

Typically, a 8 by 8 block of pixel data is transformed into a coefficient domain using the following 2D FDCT:

$$S_{vu} = \frac{1}{4} C_u C_v \sum_{x=0}^{7} \sum_{x=0}^{7} s_{yx} \cos \frac{(2x+1)u\pi}{16} \cos \frac{(2y+1)u\pi}{16} \quad (1)$$

The 2D FDCT is then computed in stages by firstly computing a row wise One Dimensional Forward Discrete Cosine Transform (1D FDCT) and then computing a column wise ID FDCT on the resultant matrix of 8 by 8 dimension. 1D FDCT may be computed using the following equation:

$$S_v = \frac{1}{4} C_v \sum_{x=0}^{7} s_x \cos \frac{(2x+1)v\pi}{16} \quad (2)$$

To achieve generic implementation of 1D transform, the cos term is replaced by a generic kernel k(x,v) as follows:

$$S_v = C_v \sum_{x=0}^{N} s_x k(x, v) \quad (3)$$

Figure 14:
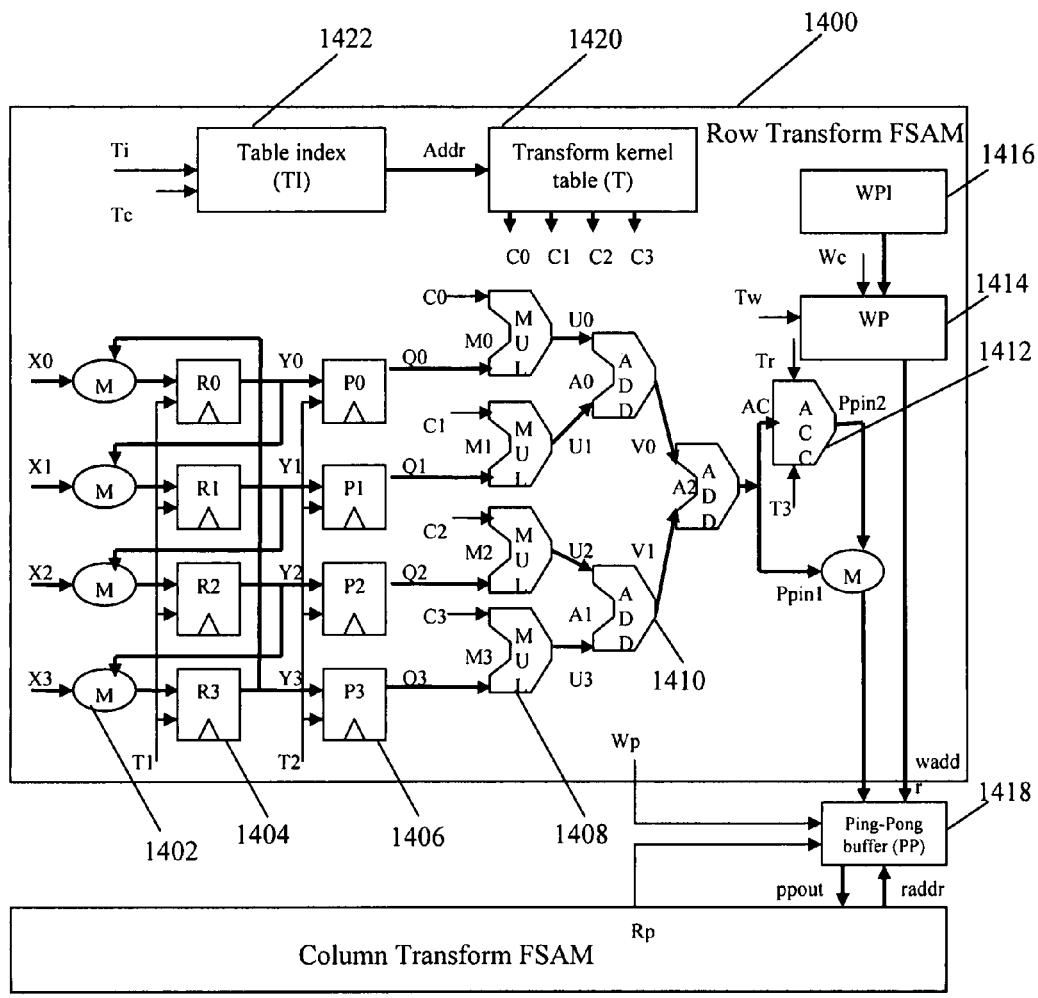
FIG. 14 depicts an expanded form of a generic 1D row transform.

FIG. 14 depicts an expanded form of a generic 1D row transform FSAM. The expanded row transform comprises one or more multiplexers 1402, one or more registers 1404, one or more second level latches 1406, one or more multipliers 1408, one or more adders 1410, special accumulator module 1412, write pointer register (WP) 1414, write pointer increment step register (WPI) 1416, ping pong buffer (PP) 1418, generic transform kernel table 1420, and table index register 1422.

Multiplexers 1402 are programmed using static scripts to select one input out of multiple inputs. Input registers 1404 are used to temporarily store the pixel data and their clocks are enabled and tied together to a clock signal T1. The pixel data is stored or latched at the edge of the clock T1 when it is enabled high. The pixel data is then stored at second level latches 1406 and their clocks are tied together to signal T2.

Special accumulator module 1412 has a register bank which stores intermediate results and an internal counter to address these registers of register bank. Initially, all the registers and the internal counter are cleared by the clock signal Tr. When T3 is high, at every clock, input is added to the register pointed to by the internal counter and the result is outputted. The counter is incremented after the result is outputted so that the next data gets added to the next register value in the next clock.

Generic transform kernel table 1420 is loaded with cosine values for DCT or may be loaded with constants of any other transform to be implemented. Table index register 1422 is loaded during the configuration and sends address to the generic transform kernel table 1420. Table index register 1422 increments on every clock when the clock signal Ti is high and clears the register when the clock signal Tc is high.

Generic transform kernel table 1420 outputs four constants C0, C1, C2, and C3 simultaneously based on the input received from table index register 1422. In an exemplary embodiment the static script for the generic row transform is depicted as:

```
TRANSFORM: FSM STATIC
BEGIN
// scripts for the Row tranform stage
R0 (X0(7-0)|Y3(7-0) ; Y0(7-0));
R1 (X1(7-0)|Y0(7-0) ; Y1(7-0));
R2 (X2(7-0)|Y1(7-0) ; Y2(7-0));
R3 (X3(7-0)|Y2(7-0) ; Y3(7-0));
P0 (Y0(7-0) ; Q0(7-0));
P1 (Y1(7-0) ; Q1(7-0));
P2 (Y2(7-0) ; Q2(7-0));
P3 (Y3(7-0) ; Q3(7-0));
M0 (Q0(7-0),C0(7-0) ; U0(9-0));
M1 (Q1(7-0),C1(7-0) ; U1(9-0));
M2 (Q2(7-0),C2(7-0) ; U2(9-0));
M3 (Q3(7-0),C3(7-0) ; U3(9-0));
A0 (U0(9-0),U1(9-0) ; V0(9-0));
A1 (U2(9-0),U3(9-0) ; V1(9-0));
A2 (V0(9-0),V1(9-0) ; Ppin1(9-0));
AC (Ppin1(9-0) ; Ppin2(9-0));
WPI (c__if(4-0) ; step(4-0)); // c__if is config interface
WP (c__if(4-0), step(4-0) ; waddr(4-0));
PP (waddr(4-0), raddr(4-0), Ppin1(9-0) | Ppin2(9-0) ; ppout(9-0));
TI(c__if(3-0) ; Addr(3-0));
T(c__if(5-0)(7-0), Addr(3-0) ; C0(7-0),C1(7-0),C2(7-0),C3(7-0));
// scripts for the Column transform stage
// similar node statements for column transform are written here
END TRANSFORM
```

In an exemplary embodiment, a static script is executed to make new connections which enable input registers 1404 to read one pixel in a single clock. The modified static script is depicted as:

```
TRANSFORM : FSM STATIC
BEGIN
R0 (X0(7-0) ; Y0(7-0));
R1 (Y0(7-0) ; Y1(7-0));
R2 (Y1(7-0) ; Y2(7-0));
R3 (Y2(7-0) ; Y3(7-0));
```

-continued

```
--- no change in the remaining nodes ---
END TRANSFORM
```

In another exemplary embodiment, a static script is executed to make new connections which enable input registers 1404 to read four pixels simultaneously in a single clock. The modified static script is depicted as:

```
TRANSFORM: FSM STATIC
BEGIN
R0 (X0(7-0) ; Y0(7-0));
R1 (X1(7-0) ; Y1(7-0));
R2 (X2(7-0) ; Y2(7-0));
R3 (X3(7-0) ; Y3(7-0));
--- no change in the remaining nodes ---
END TRANSFORM
```

Figure 15:
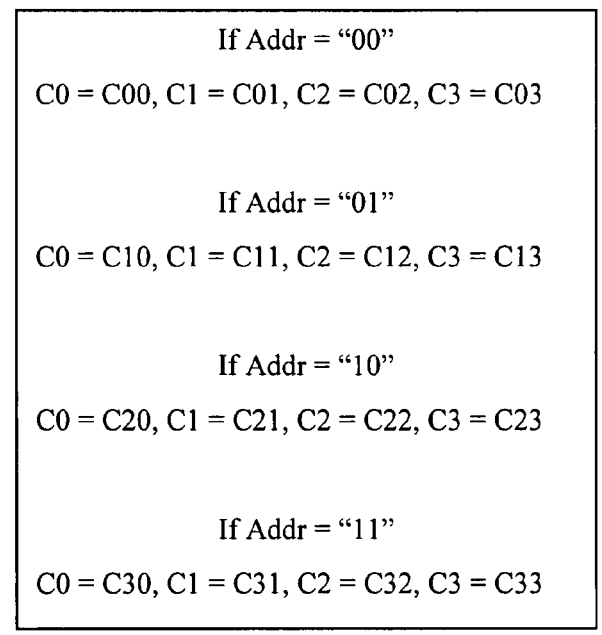
FIG. 15 depicts an organization of 4 by 4 DCT cosine constants.

In yet another exemplary embodiment, in order to configure FSAM 1400 to perform a 4 by 4 DCT, the static script depicted is modified by configuring the ping pong buffer (PP) 1418 node as:

PP (waddr(4-0), raddr(4-0), Ppin1(9-0); ppout(9-0));

While calculating 4 by 4 DCT, transform kernel table 1420 may be loaded with 16 (4 by 4) cosine constants at application initialization time. These cosine constants are organized as 4 banks of 4 constants each. FIG. 15 depicts an organization of 4 by 4 DCT cosine constants. An exemplary dynamic script for the 4 by 4 DCT row transform is depicted as:

```
CONTROL__LIST
Begin
    TRIGGER T1 0; // default (when not triggered) is 0
    TRIGGER T2 0;
    TRIGGER T3 0;
    TRIGGER Tr 0;
    TRIGGER Tw 0;
    TRIGGER Wc 0;
    TRIGGER Tc 0;
    TRIGGER Ti 0;
    TRIGGER Wp 0;
    TRIGGER Rp 0;
End
VARIABLE__LIST
Begin
S = DCT__START,0; // DCT__START is external input
End
STATE__MACHINE NewBlock S = 1
Begin
    NewBlock:
        T1, Tc, Wc, Tr; // these signals are set to 1
    LOOPN 3
    T1;
    END LOOP
    T1, T2;
    LOOPN 4
    LOOPN 3
        T1, Wp, Tw, Ti;
    END LOOP
    T1, T2, Wp, Tw, Ti;
    END LOOP
End
```

In yet another exemplary embodiment, in order to configure FSAM 1400 to perform a 8 by 8 DCT, the static script depicted earlier is modified by configuring the ping pong buffer (PP) 1418 node as:

PP (waddr(4-0), raddr(4-0), Ppin2(9-0); ppout(9-0));

While calculating 8 by 8 DCT, transform kernel table 1420 may be loaded with 16 (8 by 8) cosine constants at application initialization time. These cosine constants are organized as 16 banks of 4 constants each. FIG. 16 depicts an organization of 8 by 8 DCT cosine constants. An exemplary dynamic script for the 8 by 8 DCT row transform is depicted as:

```
CONTROL_LIST
Begin
    TRIGGER T1 0; // default (when not triggered) is 0
    TRIGGER T2 0;
    TRIGGER T3 0;
    TRIGGER Tr 0;
    TRIGGER Tw 0;
    TRIGGER Wc 0;
    TRIGGER Tc 0;
    TRIGGER Ti 0;
    TRIGGER Wp 0;
    TRIGGER Rp 0;
End
    VARIABLE_LIST
Begin
    S = DCT_START,0; // DCT_START is external input
End
STATE_MACHINE NewBlock S = 1
Begin
NewBlock:
    T1, Tc, Wc, Tr; // these signals are set to 1
    LOOPN 3
        T1;
    END LOOP
    T1, T2;
    LOOPN 8
        LOOPN 3
            T1, Ti, T3;
        END LOOP
        LOOPN 4
            Ti, T3;
        END LOOP
        T1, T2, Ti, T3;
        T1, T3, Ti;
        LOOPN 2
            T1, Tw, Wp, Ti, T3;
        END LOOP
        LOOPN 5
            Tw, Wp, Ti, T3;
        END LOOP
        T1, T2, Tw, Tr, Wp;
    END LOOP
End
```

The dynamic script is then converted into binary form by a DSAC configuration tool which may then be downloaded onto the MSE of row transform FSAM 1400.

In various embodiments, row transform FSAM 1400 may be configured for different types of transforms by loading different transform kernel matrix into transform kernel table 1420. FSAM 1400 may further be configured to perform 12 by 12 DCT or 16 by 16 DCT transforms by changing the dynamic and static scripts accordingly.

The DSAC disclosed in the present invention may be implemented in a variety of applications which require high power efficiencies and high processing speeds. Examples of areas in which the DSAC may be implemented include embedded systems with critical embedded processing applications that need to be optimized for both speed and power, a domain comprising a large number of applications that require to be supported simultaneously, and applications within a domain that have similar, clearly identifiable and isolated stages.

Next generation devices need to perform complex computational tasks at low levels of power consumption. These devices may benefit from DSAC based chips. Any modifications to the functions supported by the chip or any additional features may be easily programmed into the DSAC based chip without performing additional rounds of fabrication. This post fabrication programmability provided by DSACs result in value for product designers by shortening time-to-market of subsequent improved versions of the product. Further, chip manufacturers may design chips targeting different market segments using the same DSAC core, thereby reducing chip design time.

Therefore, the DSAC disclosed in the present invention enhances flexibility and power efficiency without sacrificing one for the other by defining a new architecture for implementing complex embedded processing applications.

While the exemplary embodiments of the present invention are described and illustrated herein, it will be appreciated that they are merely illustrative. It will be understood by those skilled in the art that various modifications in form and detail may be made therein without departing from or offending the spirit and scope of the invention as defined by the appended claims.

We claim:

1. A configurable domain specific abstract core for implementing applications within a domain comprising:
    at least one function specific abstract module configurable at a plurality of stages for implementing a predetermined function belonging to one or more applications in the domain, and comprising:
        a function specific abstract logic for implementing functional logic to implement one or more identified functions within the domain and abstracted into generic functions, wherein said abstracted generic functions are defined by a plurality of logic modules interconnected by data paths, and wherein the data paths are classified as those specific to a particular application and those generic for the implementation of the function across the domain;
        a micro state engine having a dynamic script for generating control signals, said dynamic script stored in an internal memory within the micro state engine;
        one or more data paths configured by a static script stored in an internal memory within the function specific abstract module;
        wherein one or more of a plurality of components of the micro state engine enables the function specific abstract module to perform the identified function and the corresponding abstracted generic functions; and
    a programmable hardware software interface module for coupling with one or more external computing devices.

2. The domain specific abstract core as claimed in claim 1, further comprising one or more buffer modules for data exchange among one or more function specific abstract modules, and for temporary storage of data.

3. The domain specific abstract core as claimed in claim 2, wherein the buffer module is operable in a plurality of operation modes based upon nature of data being exchanged.

4. The domain specific abstract core as claimed in claim 3, wherein the buffer module is operated in a ping pong mode when the data being exchanged is in the form of packets of a predetermined size.

5. The domain specific abstract core as claimed in claim 3, wherein the buffer module is operated in a first in first out mode when the data being exchanged is in the form of a continuous stream.

6. The domain specific abstract core as claimed in claim 3, wherein the buffer module is operated in a pass through mode when the data being exchanged does not require to be temporarily stored.

7. The domain specific abstract core as claimed in claim 2, wherein the buffer module is operated in conjunction with a software hook interface enabling software modules running on external computing devices to read from and write into the buffer module.

8. The domain specific abstract core as claimed in claim 1, being configurable at a design configuration stage.

9. The domain specific abstract core as claimed in claim 1, being configurable at an application initialization configuration stage.

10. The domain specific abstract core as claimed in claim 1, being configurable at a run time configuration stage.

11. The domain specific abstract core as claimed in claim 1, wherein the data paths among the one or more function specific abstract modules and the one or more buffers may be configured by executing one or more static scripts.

12. The domain specific abstract core as claimed in claim 1, wherein the data paths among the one or more function specific abstract modules and the one or more buffers may be configured by executing one or more instructions written in a programming language.

13. The domain specific abstract core as claimed in claim 1, being configurable to implement a data driven control flow architecture.

14. The domain specific abstract core as claimed in claim 1, wherein the function specific abstract module further comprises a programmable connection map specifying data path connections and regulating data flow within the function specific abstract logic.

15. The domain specific abstract core as claimed in claim 14, wherein a static script is implemented for specifying data flow within the function specific abstract module.

16. The domain specific abstract core as claimed in claim 14, wherein instructions written in a programming language are executed for specifying data flow within the function specific abstract module.

17. The domain specific abstract core as claimed in claim 1, wherein the function specific abstract module is configurable at an application initialization configuration stage of the domain specific abstract core by a configuration tool via a configuration interface.

18. The domain specific abstract core as claimed in claim 1, wherein the function specific abstract module is configurable at a run time configuration stage of the domain specific abstract core by a configuration tool via a configuration interface.

19. The domain specific abstract core as claimed in claim 17 or 18, wherein the configuration tool processes one or more initialization values of one or more registers of the function specific abstract module and a static script to convert them to a binary file, the binary file being downloaded onto the function specific abstract module during the application initialization stage of the domain specific abstract core.

20. The domain specific abstract core as claimed in claim 1, wherein the micro state engine comprises:
 a local program memory for storing the dynamic script;
 a program counter for navigating through a series of instructions specified by the dynamic script; and
 a set of registers for storing intermediate values and states.

21. The domain specific abstract core as claimed in claim 20, wherein the micro state engine further comprises a decision vector space that determines a next instruction to be navigated by the program counter.

22. The domain specific abstract core as claimed in claim 20, wherein the micro state engine further comprises a configurable logic block that applies a configurable logical operation on a set of control signals and/or registers.

23. The domain specific abstract core as claimed in claim 20, wherein the micro state engine further comprises an extended program memory control to extend the local program memory.

24. The domain specific abstract core as claimed in claim 20, wherein the micro state engine further comprises a control driver for buffering and driving control signals.

25. The domain specific abstract core as claimed in claim 20, wherein the local program memory is an extended shared multi-port memory connected to two or more function specific abstract modules.

26. The domain specific abstract core as claimed in claim 1, wherein the programmable hardware software interface module comprises:
 an external bus interface for enabling interaction between the domain specific abstract core and an external computing device, the external bus interface communicating with the external computing device via an external system bus; and
 an internal configuration and data interface for enabling communication of the programmable hardware software interface module with the one or more function specific abstract modules via a configuration interface bus and a hook interface bus.

27. The domain specific abstract core as claimed in claim 26, wherein the programmable hardware software interface module further comprises a JTAG interface for testing and debugging of the domain specific abstract core by an external microprocessor.

28. A method of designing a configurable function specific abstract module within a configurable domain specific abstract core, for implementing a predetermined function belonging to applications in a domain, comprising:
 identifying a function to be implemented within said domain;
 abstracting the identified function into a generic function;
 building said abstracted generic function using logic modules, and
 building data path connections among the logic modules;
 classifying said data path connections as those that are specific to a particular application and those that are generic for the implementation of the function across the domain;
 providing, by a configuration tool having a configuration interface, functional logic within the function specific abstract module, said function specific abstract module having:
 (i) data paths configured by a static script, said static script generated and thereafter stored in an internal memory within the function specific abstract module by said configuration tool, and
 (ii) a micro state engine having a dynamic script for generating control signals, said dynamic script generated and thereafter stored in an internal memory within said micro state engine, by said configuration tool;
 defining and initializing one or more of a plurality of components of the micro state engine for enabling the function specific abstract module to perform the identified function and the corresponding abstracted generic function; and
 synthesizing the function specific abstract module with the domain specific abstract core.

29. The method as claimed in claim 28, wherein the step of classifying the data path connections as those that are specific to a particular application and those that are generic for the implementation of the function across the domain comprises the step of making the data path connections, that are generic for the implementation of the function across the domain, non-configurable.

30. The method as claimed in claim 28, wherein the step of classifying the data path connections as those that are specific to a particular application and those that are generic for the implementation of the function across the domain comprises the step of making the data path connections that are specific to a particular application configurable by using one or more static scripts.

31. The method as claimed in claim 30, wherein the step of making the data path connections that are specific to a particular application configurable is performed by executing instructions written in a programming language.

32. The method as claimed in claim 28, wherein the control signals are generated by a micro state engine within the function specific abstract module by executing instructions written in a programming language.

33. The method as claimed in claim 28, wherein the step of defining and initializing one or more components of the micro state engine comprises the steps of:

defining and initializing a local program memory for storing and executing the dynamic script;
  defining and initializing a program counter to navigate through a series of instructions as specified by the dynamic script stored in local program memory; and
  defining and initializing a set of registers for storing intermediate values and states.

34. The method as claimed in claim 33, wherein the step of defining and initializing one or more components of the micro state engine further comprises the steps of:

defining and initializing a decision vector space that determines a next instruction to be navigated by the program counter;
  defining and initializing a configurable logic block that applies a configurable logical operation on a set of control signals and/or registers;
  defining and initializing an extended program memory control to extend the local program memory; and
  defining and initializing a control driver for buffering and driving control signals.

* * * * *